US012720723B2

(12) United States Patent
Chuang

(10) Patent No.: US 12,720,723 B2
(45) Date of Patent: Aug. 25, 2026

(54) MEMORY DEVICE INCLUDING CAPACITOR CONTACTS HAVING DIFFERENT MATERIALS AND METHOD FOR PREPARING THE SAME

(71) Applicant: NANYA TECHNOLOGY CORPORATION, New Taipei City (TW)

(72) Inventor: Ying-Cheng Chuang, Taoyuan City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 351 days.

(21) Appl. No.: 18/443,709

(22) Filed: Feb. 16, 2024

(65) Prior Publication Data

US 2025/0240938 A1 Jul. 24, 2025

Related U.S. Application Data

(62) Division of application No. 18/419,854, filed on Jan. 23, 2024.

(51) Int. Cl.
*H10B 12/00* (2023.01)
*H10D 1/68* (2025.01)

(52) U.S. Cl.
CPC ....... *H10B 12/033* (2023.02); *H10B 12/0335* (2023.02); *H10B 12/315* (2023.02);
(Continued)

(58) Field of Classification Search
CPC .. H10B 12/033; H10B 12/0335; H10B 12/31; H10B 12/315; H10B 12/37; H10B 12/482; H10B 12/485; H10B 12/50; H10D 1/692
See application file for complete search history.

(56) References Cited

U.S. PATENT DOCUMENTS

| | | | | |
|---|---|---|---|---|
| 11,121,135 B1 * | 9/2021 | Ikeda | .................. | H10B 12/315 |
| 2022/0352102 A1 * | 11/2022 | Chen | .................. | H10B 12/0335 |
| 2023/0078026 A1 * | 3/2023 | Kim | .................. | H10B 12/488 257/330 |

FOREIGN PATENT DOCUMENTS

| | | | |
|---|---|---|---|
| CN | 103489866 A * | 1/2014 | .............. H10P 14/40 |
| CN | 104103578 A * | 10/2014 | ......... H10D 64/0112 |

(Continued)

OTHER PUBLICATIONS

Office Action and and the search report mailed on Jun. 3, 2025 related to Taiwanese Application No. 113120778.

(Continued)

*Primary Examiner* — Matthew E Warren
(74) *Attorney, Agent, or Firm* — Xuan Zhang

(57) ABSTRACT

A memory device includes a bit line structure disposed over a semiconductor substrate, and a lower capacitor contact disposed in and extending above the semiconductor substrate. The lower capacitor contact includes polysilicon. The memory device also includes an upper capacitor contact disposed over the lower capacitor contact. The upper capacitor contact includes titanium nitride. The memory device further includes a first spacer layer disposed between the lower capacitor contact and the bit line structure and between the upper capacitor contact and the bit line structure. In addition, the memory device includes a capacitor disposed over the first spacer layer.

9 Claims, 27 Drawing Sheets

(52) U.S. Cl.
CPC ......... *H10B 12/482* (2023.02); *H10B 12/485* (2023.02); *H10B 12/50* (2023.02); *H10D 1/692* (2025.01); *H10B 12/37* (2023.02)

(56) References Cited

FOREIGN PATENT DOCUMENTS

| | | | | | |
|---|---|---|---|---|---|
| KR | 102691653 | B1 | * | 8/2024 | ............. H10D 89/10 |
| SG | 10201803879X | | * | 4/2019 | ......... H01L 21/7682 |
| TW | 200408065 | A | | 5/2004 | |
| TW | 200739884 | A | | 10/2007 | |
| TW | 202249247 | A | | 12/2022 | |
| TW | I913754 | B | * | 2/2026 | |

OTHER PUBLICATIONS

Summary translations of Office Actions and and the search reports mailed on Jun. 3, 2025 related to Taiwanese Application No. 113120778 and Aug. 18, 2025 related to Taiwanese Application No. 114106380.

Office Action and and the search report mailed on Aug. 18, 2025 related to Taiwanese Application No. 114106380.

* cited by examiner

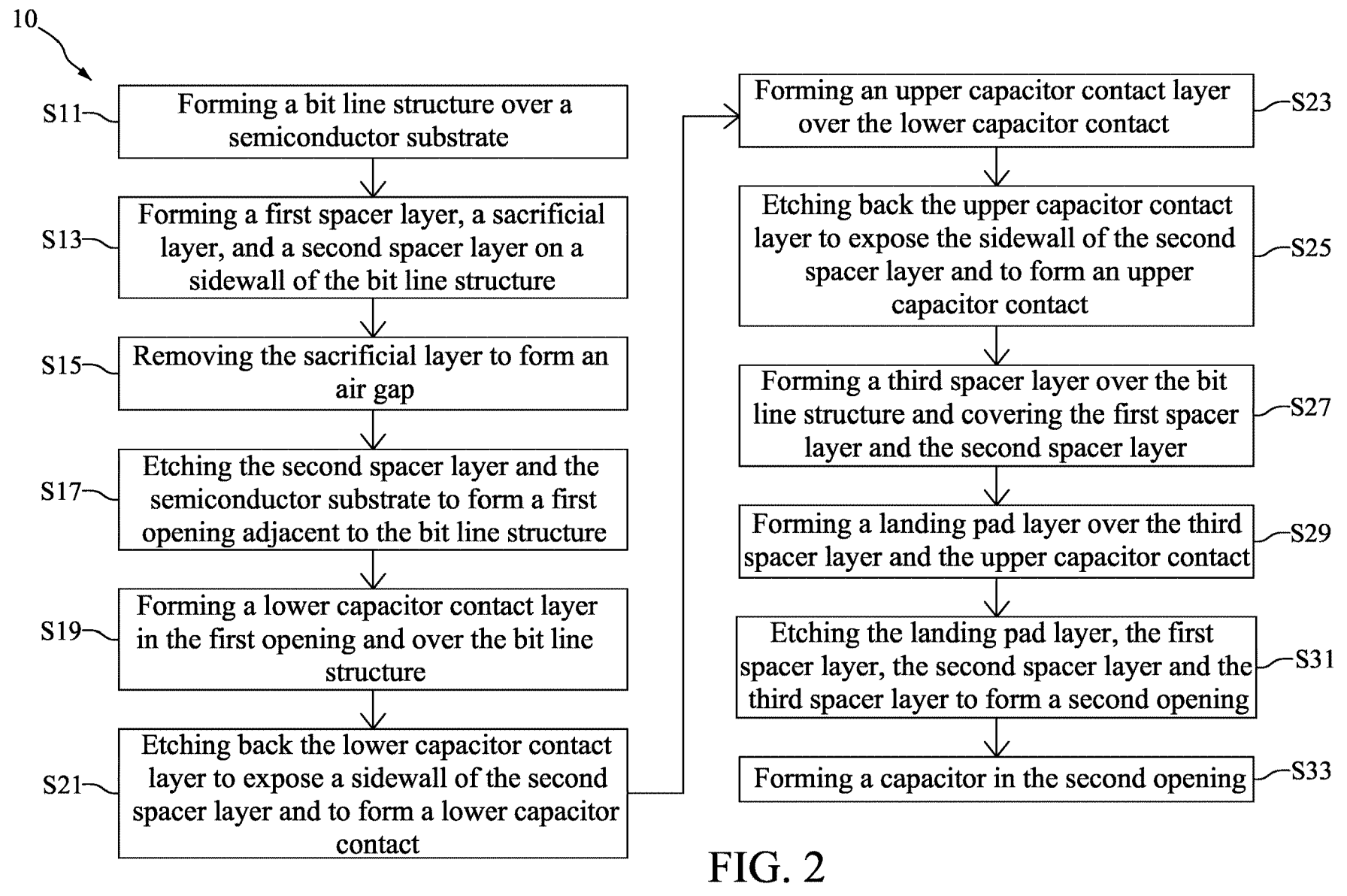

10

S11 Forming a bit line structure over a semiconductor substrate

S13 Forming a first spacer layer, a sacrificial layer, and a second spacer layer on a sidewall of the bit line structure S15 Removing the sacrificial layer to form an air gap S17 Etching the second spacer layer and the semiconductor substrate to form a first opening adjacent to the bit line structure S19 Forming a lower capacitor contact layer in the first opening and over the bit line structure S21 Etching back the lower capacitor contact layer to expose a sidewall of the second spacer layer and to form a lower capacitor contact S23 Forming an upper capacitor contact layer over the lower capacitor contact S25 Etching back the upper capacitor contact layer to expose the sidewall of the second spacer layer and to form an upper capacitor contact S27 Forming a third spacer layer over the bit line structure and covering the first spacer layer and the second spacer layer S29 Forming a landing pad layer over the third spacer layer and the upper capacitor contact S31 Etching the landing pad layer, the first spacer layer, the second spacer layer and the third spacer layer to form a second opening S33 Forming a capacitor in the second opening

FIG. 2

MEMORY DEVICE INCLUDING CAPACITOR CONTACTS HAVING DIFFERENT MATERIALS AND METHOD FOR PREPARING THE SAME

CROSS-REFERENCE TO RELATED APPLICATION

This application is a divisional application of U.S. Non-Provisional application Ser. No. 18/419,854 filed Jan. 23, 2024, which is incorporated herein by reference in its entirety.

TECHNICAL FIELD

The present disclosure relates to a memory device and a method for preparing the same, and more particularly, to a memory device including capacitor contacts having different materials and a method for preparing the same.

DISCUSSION OF THE BACKGROUND

Due to structural simplicity, dynamic random access memories (DRAMs) can provide more memory cells per unit chip area than other types of memories, such as static random access memories (SRAMs). A DRAM is constituted by a plurality of DRAM cells, each of which includes a capacitor for storing information and a transistor coupled to the capacitor for regulating when the capacitor is charged or discharged. During a read operation, a word line (WL) is asserted, turning on the transistor. The enabled transistor allows the voltage across the capacitor to be read by a sense amplifier through a bit line (BL). During a write operation, the data to be written is provided on the BL while the WL is asserted.

To satisfy the demand for greater memory storage, the dimensions of the DRAM memory cells have continuously shrunk so that the packing densities of these DRAMs have increased considerably. However, the manufacturing and integration of memory devices involve many complicated steps and operations. Integration in memory devices becomes increasingly complicated. An increase in complexity of manufacturing and integration of the memory device may cause deficiencies. Accordingly, there is a continuous need to improve the structure and the manufacturing process of memory devices so that the deficiencies can be addressed, and the performance can be enhanced.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a memory device is provided. The memory device includes a bit line structure disposed over a semiconductor substrate, and a lower capacitor contact disposed in and extending above the semiconductor substrate. The lower capacitor contact includes polysilicon. The memory device also includes an upper capacitor contact disposed over the lower capacitor contact. The upper capacitor contact includes titanium nitride (TiN). The memory device further includes a first spacer layer disposed between the lower capacitor contact and the bit line structure and between the upper capacitor contact and the bit line structure. In addition, the memory device includes a capacitor disposed over the first spacer layer.

In an embodiment, the upper capacitor contact is in direct contact with the lower capacitor contact. In an embodiment, a height of the upper capacitor contact is greater than or equal to a height of the lower capacitor contact. In an embodiment, a ratio of a height of the upper capacitor contact to a height of the lower capacitor contact is in a range from about 1 to about 1.5. In an embodiment, the memory device further includes a second spacer layer disposed between the lower capacitor contact and the first spacer layer and between the upper capacitor contact and the first spacer layer, wherein an air gap is disposed between the first spacer layer and the second spacer layer.

In an embodiment, the memory device further includes a bit line mask layer disposed over the bit line structure, wherein the capacitor is disposed over and in direct contact with the bit line mask layer. In an embodiment, a top surface of the bit line mask layer is higher than a top surface of the upper capacitor contact. In an embodiment, the memory device further includes a third spacer layer covering the bit line mask layer, wherein the third spacer layer extends to contact the upper capacitor contact. In an embodiment, the memory device further includes a landing pad disposed over the upper capacitor contact, wherein the landing pad is in direct contact with the third spacer layer. In an embodiment, the landing pad is in direct contact with the upper capacitor contact.

In another embodiment of the present disclosure, a memory device is provided. The memory device includes a bit line structure disposed over a semiconductor substrate, and a lower capacitor contact disposed in and extending above the semiconductor substrate. The memory device also includes an upper capacitor contact disposed over the lower capacitor contact. The upper capacitor contact and the lower capacitor contact include different materials. The memory device further includes a first spacer layer disposed between the lower capacitor contact and the bit line structure and between the upper capacitor contact and the bit line structure. In addition, the memory device includes a capacitor disposed over the first spacer layer, and a landing pad disposed over the upper capacitor contact and in direct contact with the capacitor.

In an embodiment, the lower capacitor contact includes polysilicon, and the upper capacitor contact includes titanium nitride (TiN). In an embodiment, a height of the upper capacitor contact is greater than or equal to a height of the lower capacitor contact. In an embodiment, a ratio of the height of the upper capacitor contact to the height of the lower capacitor contact is in a range from about 1 to about 1.5. In an embodiment, the lower capacitor contact is in direct contact with the upper capacitor contact, and the upper capacitor contact is in direct contact with the landing pad.

In an embodiment, the memory device further includes a second spacer layer separating the lower capacitor contact and the upper capacitor contact from the first spacer layer, wherein an air gap is disposed between the first spacer layer and the second spacer layer. In an embodiment, the second spacer layer is in direct contact with the lower capacitor contact and the upper capacitor contact. In an embodiment, the memory device further includes a third spacer layer disposed over the upper capacitor contact and separating the landing pad from the second spacer layer, wherein the third spacer layer is in direct contact with the capacitor and the upper capacitor contact. In an embodiment, the memory device further includes a bit line mask layer disposed between the bit line structure and the capacitor, wherein the first spacer layer and the second spacer layer extend between the bit line mask layer and the landing pad. In an embodiment, a top surface of the bit line mask layer is higher than a top surface of the upper capacitor contact.

In yet another embodiment of the present disclosure, a method for preparing a memory device is provided. The method includes forming a bit line structure over a semiconductor substrate, and forming a first spacer layer and a second spacer layer on a sidewall of the bit line structure. The method also includes etching the second spacer layer and the semiconductor substrate to form a first opening adjacent to the bit line structure, and filling the first opening with a lower capacitor contact. The lower capacitor contact protrudes over the semiconductor substrate. The method further includes forming an upper capacitor contact over the lower capacitor contact. The upper capacitor contact and the lower capacitor contact include different materials. In addition, the method includes forming a landing pad layer over the upper capacitor contact, etching the landing pad layer, the first spacer layer and the second spacer layer to form a second opening, and forming a capacitor in the second opening.

In an embodiment, the method further includes forming a bit line mask layer over the bit line structure, wherein the first spacer layer extends to cover a sidewall of the bit line mask layer. In an embodiment, a top surface of the bit line mask layer is higher than a top surface of the upper capacitor contact, and the bit line mask layer is partially removed to form the second opening. In an embodiment, the method further includes forming a third spacer material covering the first spacer layer, the second spacer layer and the upper capacitor contact, and partially removing the third spacer material to expose the upper capacitor contact before the landing pad layer is formed. In an embodiment, the forming the lower capacitor contact includes filling the first opening with a lower capacitor contact layer, wherein the lower capacitor contact layer extends over the first spacer layer, the second spacer layer and the bit line structure. In addition, the forming the lower capacitor contact includes etching back the lower capacitor contact layer to expose a sidewall of the second spacer layer. In an embodiment, the lower capacitor contact layer includes polysilicon.

In an embodiment, the forming the upper capacitor contact includes forming an upper capacitor contact layer over the lower capacitor contact, wherein the upper capacitor contact layer extends over the first spacer layer, the second spacer layer and the bit line structure. In addition, the forming the upper capacitor contact includes etching back the upper capacitor contact layer to expose a sidewall of the second spacer layer. In an embodiment, the upper capacitor contact layer includes titanium nitride (TiN). In an embodiment, the method further includes forming a sacrificial layer on a sidewall of the first spacer layer before the second spacer layer is formed, and removing the sacrificial layer to form an air gap before the first opening is formed. In an embodiment, the method further includes forming a sacrificial layer on a sidewall of the first spacer layer before the second spacer layer is formed, and removing the sacrificial layer through the second opening to form an air gap.

Embodiments of a memory device and method for preparing the same are provided in the disclosure. In some embodiments, the memory device includes a bit line structure disposed over a semiconductor substrate, a lower capacitor contact disposed in and extending above the semiconductor substrate, and an upper capacitor contact disposed over the lower capacitor contact. The lower capacitor contact and the upper capacitor contact include different materials, and a height of the upper capacitor contact is greater than or equal to a height of the lower capacitor contact. Therefore, the sheet resistances of the capacitor contacts can be reduced while eliminating or suppressing the junction leak current. As a result, the performance of the memory device can be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a flow diagram illustrating a method for preparing a memory device, in accordance with some embodiments.

DETAILED DESCRIPTION

Figure 1:
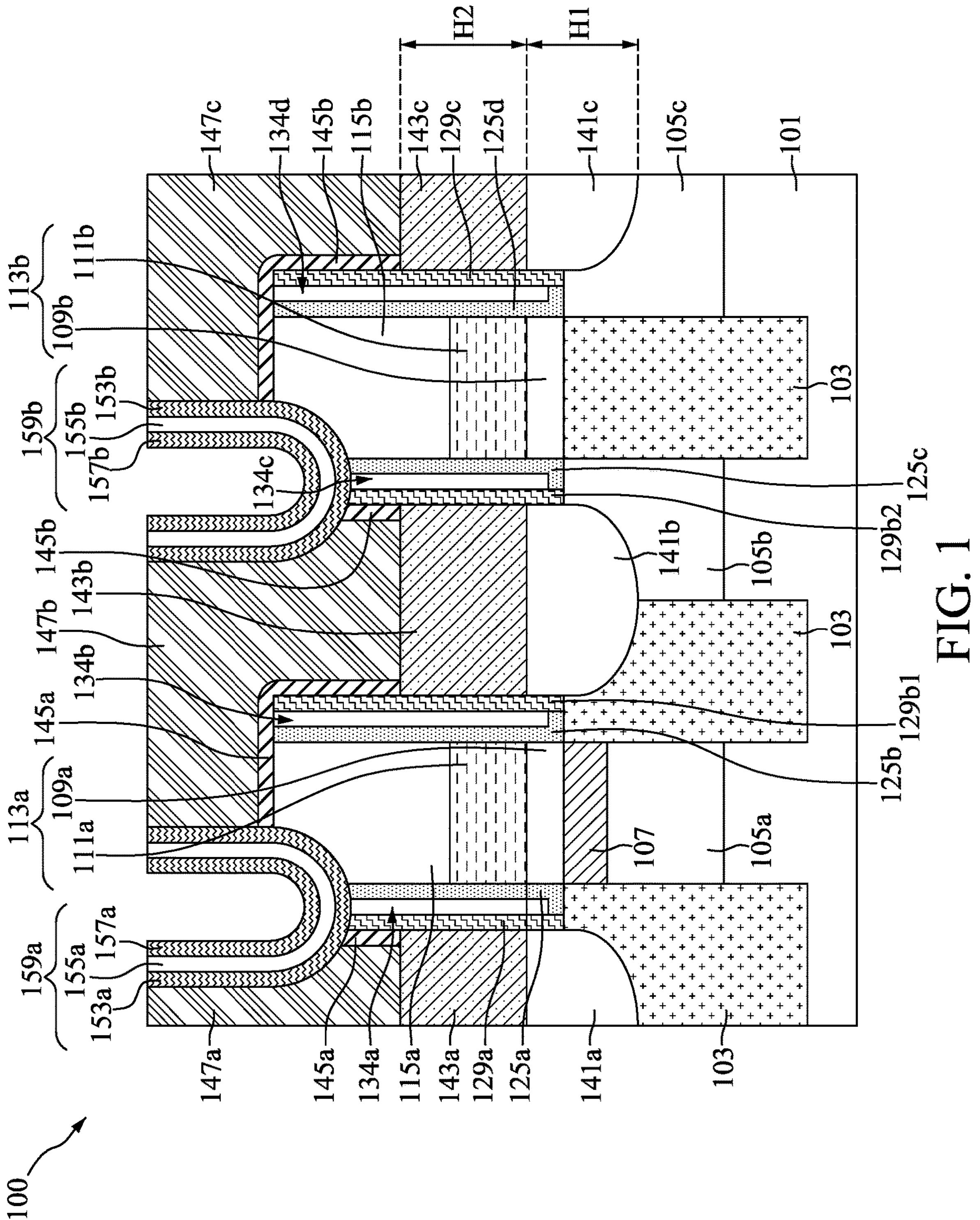
FIG. 1 is a cross-sectional view illustrating a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view illustrating a memory device 100, in accordance with some embodiments. As shown in FIG. 1, the memory device 100 includes a semiconductor substrate 101, isolation structures 103 and doped regions 105*a*, 105*b* and 105*c* disposed in the semiconductor substrate 101. In some embodiments, the doped regions 105*a*, 105*b* and 105*c* are active regions that are electrically isolated from each other by the isolation structures 103. In addition, the memory device 100 includes a bit line contact 107 disposed in the doped region 105*a*.

Moreover, the memory device 100 includes bit line structures 113*a* and 113*b* disposed over the semiconductor substrate 101. In some embodiments, the bit line structure 113*a* includes a lower bit line layer 109*a* and an upper bit line layer 111*a* disposed over the lower bit line layer 109*a*. In some embodiments, the bit line structure 113*b* includes a lower bit line layer 109*b* and an upper bit line layer 111*b* disposed over the lower bit line layer 109*b*. In addition, bit line mask layers 115*a* and 115*b* are disposed over the bit line structures 113*a* and 113*b*, respectively.

In some embodiments, lower capacitor contacts 141*a*, 141*b* and 141*c* are disposed in and extending above the semiconductor substrate 101. In some embodiments, the lower capacitor contacts 141*a*, 141*b* and 141*c* are adjacent to the bit line structures 113*a* and 113*b*. For example, the lower capacitor contact 141*a* is disposed adjacent to the bit line structure 113*a*, the lower capacitor contact 141*b* is disposed between and adjacent to the bit line structures 113*a* and 113*b*, and the lower capacitor contact 141*c* is disposed adjacent to the bit line structure 113*b*. In some embodiments, the upper capacitor contacts 143*a*, 143*b* and 143*c* are disposed over the lower capacitor contacts 141*a*, 141*b* and 141*c*, respectively. In some embodiments, the upper capacitor contacts 143*a*, 143*b* and 143*c* are in direct contact with the lower capacitor contacts 141*a*, 141*b* and 141*c*, respectively.

In some embodiments, first spacer layers 125*a* and 125*b* are disposed on and in direct contact with opposite sidewalls of the bit line structure 113*a*, and first spacer layers 125*c* and 125*d* are disposed on and in direct contact with opposite sidewalls of the bit line structure 113*b*. Moreover, the first spacer layers 125*a* and 125*b* extend to cover opposite sidewalls of the bit line mask layer 115*a*, and the first spacer layers 125*c* and 125*d* extend to cover opposite sidewalls of the bit line mask layer 115*b*, in accordance with some embodiments.

In addition, a second spacer layer 129*a* is disposed between the lower capacitor contact 141*a* and the first spacer layer 125*a* and between the upper capacitor contact 143*a* and the first spacer layer 125*a*, and an air gap 134*a* is between the first spacer layer 125*a* and the second spacer layer 129*a*, in accordance with some embodiments. In some embodiments, a second spacer layer 129*b*1 is disposed between the lower capacitor contact 141*b* and the first spacer layer 125*b* and between the upper capacitor contact 143*b* and the first spacer layer 125*b*, and an air gap 134*b* is between the first spacer layer 125*b* and the second spacer layer 129*b*1.

In some embodiments, a second spacer layer 129*b*2 is disposed between the lower capacitor contact 141*b* and the first spacer layer 125*c* and between the upper capacitor contact 143*b* and the first spacer layer 125*c*, and an air gap 134*c* is between the first spacer layer 125*c* and the second spacer layer 129*b*2. In some embodiments, a second spacer layer 129*c* is disposed between the lower capacitor contact 141*c* and the first spacer layer 125*d* and between the upper capacitor contact 143*c* and the first spacer layer 125*d*, and an air gap 134*d* is between the first spacer layer 125*d* and the second spacer layer 129*c*.

The memory device also includes third spacer layers 145*a* and 145*b*. In some embodiments, the third spacer layer 145*a* covers the bit line mask layer 115*a*, the first spacer layer 125*b* and the second spacer layer 129*b*1, and the third spacer layer 145*a* extends to directly contact the upper capacitor contacts 143*a* and 143*b*. In some embodiments, the third spacer layer 145*b* covers the bit line mask layer 115*b*, the first spacer layer 125*d* and the second spacer layer 129*c*, and the third spacer layer 145*b* extends to directly contact the upper capacitor contacts 143*b* and 143*c*. In some embodiments, the air gap 134*b* is sealed by the third spacer layer 145*a*, and the air gap 134*d* is sealed by the third spacer layer 145*b*.

The memory device 100 further includes landing pads 147*a*, 147*b* and 147*c* disposed over the upper capacitor contacts 143*a*, 143*b* and 143*c*, respectively. In some embodiments, the landing pads extend over one of the adjacent bit line mask layers. For example, the landing pad 147*b* extends over the bit line mask layer 115*a*, and the landing pad 147*c* extends over the bit line mask layer 115*b*, in accordance with some embodiments.

In some embodiments, the first spacer layer 125*a*, the air gap 134*a* and the second spacer layer 129*a* extend between the bit line mask layer 115*a* and the landing pad 147*a*. In some embodiments, the first spacer layer 125*b*, the air gap 134*b* and the second spacer layer 129*b*1 extend between the bit line mask layer 115*a* and the landing pad 147*b*. In some embodiments, the first spacer layer 125*c*, the air gap 134*c* and the second spacer layer 129*b*2 extend between the bit line mask layer 115*b* and the landing pad 147*b*. In some embodiments, the first spacer layer 125*d*, the air gap 134*d* and the second spacer layer 129*c* extend between the bit line mask layer 115*b* and the landing pad 147*c*.

In some embodiments, the bit line mask layer 115*a*, the first spacer layer 125*b*, the air gap 134*b* and the second spacer layer 129*b*1 are separated from the landing pad 147*b* by the third spacer layer 145*a*. In some embodiments, the bit line mask layer 115*b*, the first spacer layer 125*d*, the air gap 134*d* and the second spacer layer 129*c* are separated from the landing pad 147*c* by the third spacer layer 145*b*.

Furthermore, the memory device 100 includes a capacitor 159*a* disposed over the first spacer layer 125*a*, the air gap 134*a* and the second spacer layer 129*a*, and a capacitor 159*b* disposed over the first spacer layer 125*c*, the air gap 134*c* and the second spacer layer 129*b*2, in accordance with some embodiments. In some embodiments, the capacitor 159*a* includes a bottom electrode 153*a*, a top electrode 157*a* disposed over and surrounded by the bottom electrode 153*a*, and a capacitor dielectric layer 155*a* sandwiched between the bottom electrode 153*a* and the top electrode 157*a*. In some embodiments, the capacitor 159*b* includes a bottom electrode 153*b*, a top electrode 157*b* disposed over and surrounded by the bottom electrode 153*b*, and a capacitor dielectric layer 155*b* sandwiched between the bottom electrode 153*b* and the top electrode 157*b*.

Embodiments of the memory device 100 and method for preparing the same are provided in the disclosure. In some embodiments, the lower capacitor contacts 141*a*, 141*b*, 141*c* and the upper capacitor contacts 143*a*, 143*b*, 143*c* include different materials. In some embodiments, the lower capacitor contacts 141*a*, 141*b*, 141*c* include polysilicon, and the upper capacitor contacts 143*a*, 143*b*, 143*c* include titanium nitride (TiN). In some embodiments, the lower capacitor contacts 141*a*, 141*b*, 141*c* have a height H1, the upper capacitor contacts 143*a*, 143*b*, 143*c* have a height H2, and the height H2 is greater than or equal to the height H1. In some embodiments, a ratio of the height H2 to the height H1 is in a range from about 1 to about 1.5. Therefore, the sheet resistances of the capacitor contacts can be reduced while eliminating or suppressing the junction leak current. In addition, the air gaps 134*a*, 134*b*, 134*c* and 134*d* may help to reduce parasitic capacitance and correspondingly improve device performance (e.g., by reducing signal noise). As a result, the performance of the memory device 100 can be improved.

FIG. 2 is a flow diagram illustrating a method 10 for preparing the memory device 100, and the method 10 includes steps S11, S13, S15, S17, S19, S21, S23, S25, S27, S29, S31 and S33, in accordance with some embodiments. The steps S11 to S33 of FIG. 2 are elaborated in connection with FIGS. 4 to 22.

Figure 3:
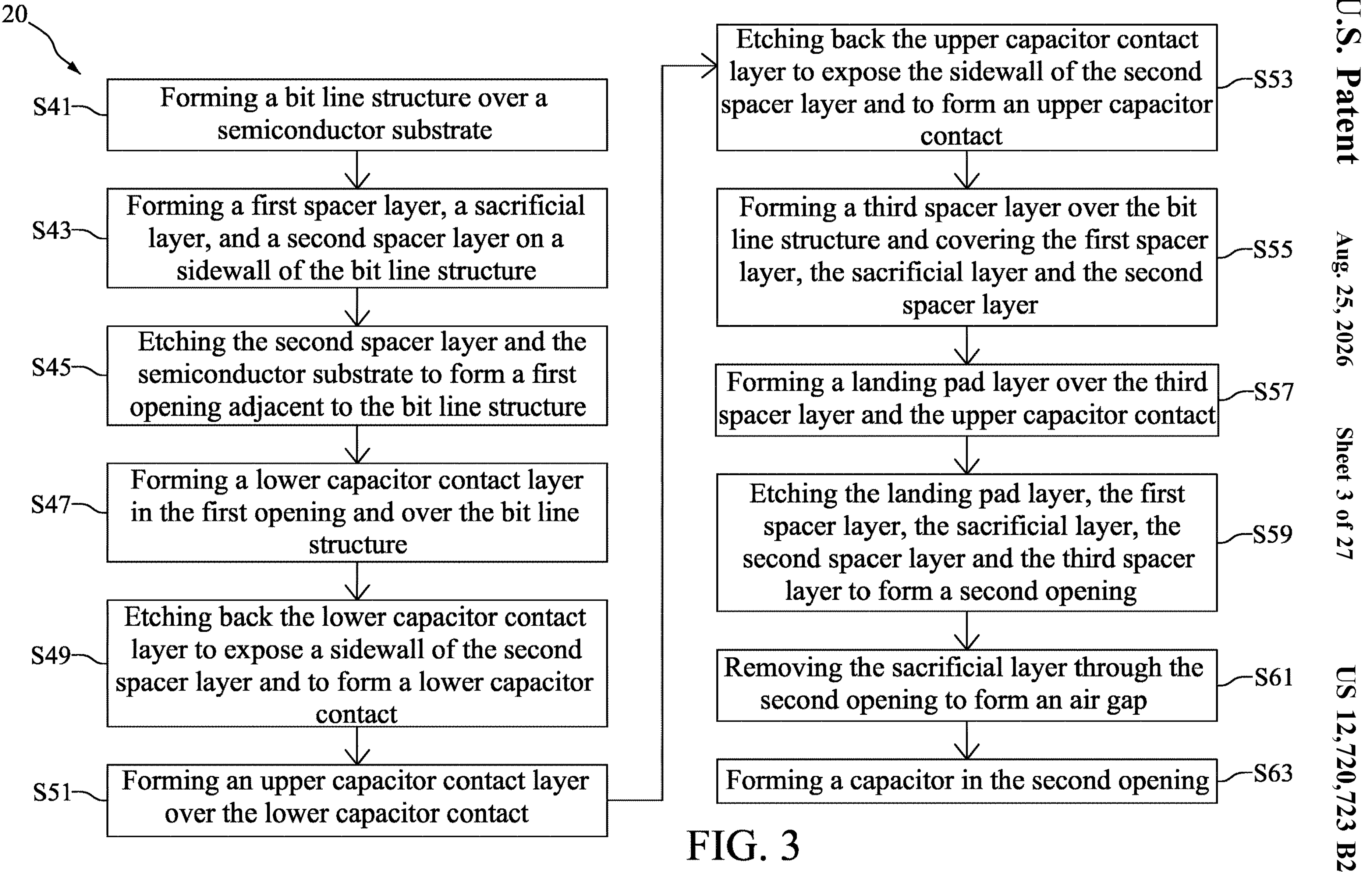
FIG. 3 is a flow diagram illustrating a method for preparing a memory device, in accordance with some alternative embodiments.

FIG. 3 is a flow diagram illustrating a method 20 for preparing the memory device 100, and the method 20 includes steps S41, S43, S45, S47, S49, S51, S53, S55, S57, S59, S61 and S63, in accordance with some alternative embodiments. The steps S41 to S63 of FIG. 3 are elaborated in connection with FIGS. 23 to 27.

FIGS. 4 to 22 are cross-sectional views illustrating intermediate stages in the formation of the memory device 100, in accordance with some embodiments.

Figure 4:
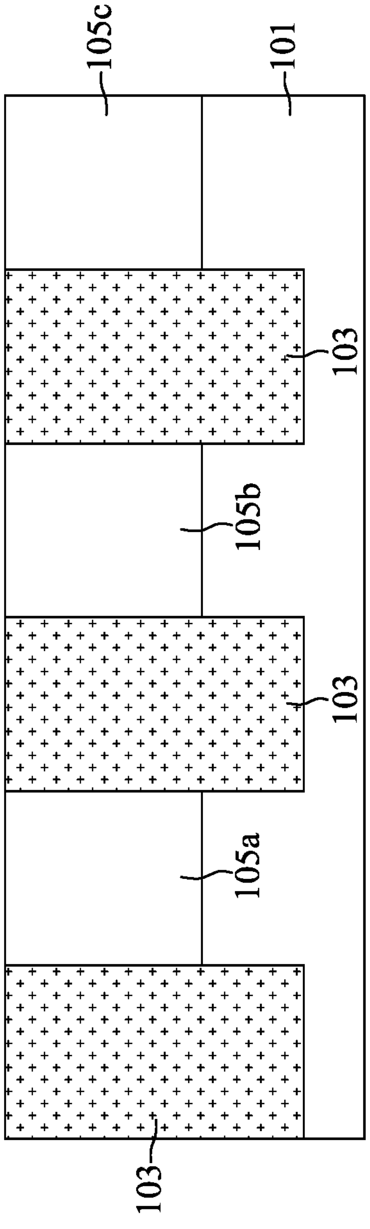
FIG. 4 is a cross-sectional view illustrating an intermediate stage of forming isolation structures and doped regions in a semiconductor substrate during the formation of the memory device, in accordance with some embodiments.

As shown in FIG. 4, the semiconductor substrate 101 is provided. The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other applicable methods.

Still referring to FIG. 4, the isolation structures 103 are formed in the semiconductor substrate 101, and the isolation structures 103 are shallow trench isolation (STI) structures, in accordance with some embodiments. In addition, the isolation structures 103 may include silicon oxide, silicon nitride, silicon oxynitride or another applicable dielectric material, and the formation of the isolation structures 103 may include forming a patterned mask (not shown) over the semiconductor substrate 101, etching the semiconductor substrate 101 to form openings (not shown) by using the patterned mask as a mask, depositing a dielectric material in the openings and over the semiconductor substrate 101, and planarizing the dielectric material until the semiconductor substrate 101 is exposed.

Moreover, doped regions 105*a*, 105*b* and 105*c* are formed in the active regions defined by the isolation structures 103. In some embodiments, the doped regions 105*a*, 105*b* and 105*c* are formed by one or more ion implantation processes, and P-type dopants, such as boron (B), gallium (Ga), or indium (In), or N-type dopants, such as phosphorous (P) or arsenic (As), can be implanted in the active regions to form the doped regions 105*a*, 105*b* and 105*c*, depending on the conductivity type of the memory device 100. In addition, the doped regions 105*a*, 105*b* and 105*c* will become the source/drain regions of the memory device 100 in the subsequent processes.

Figure 5:
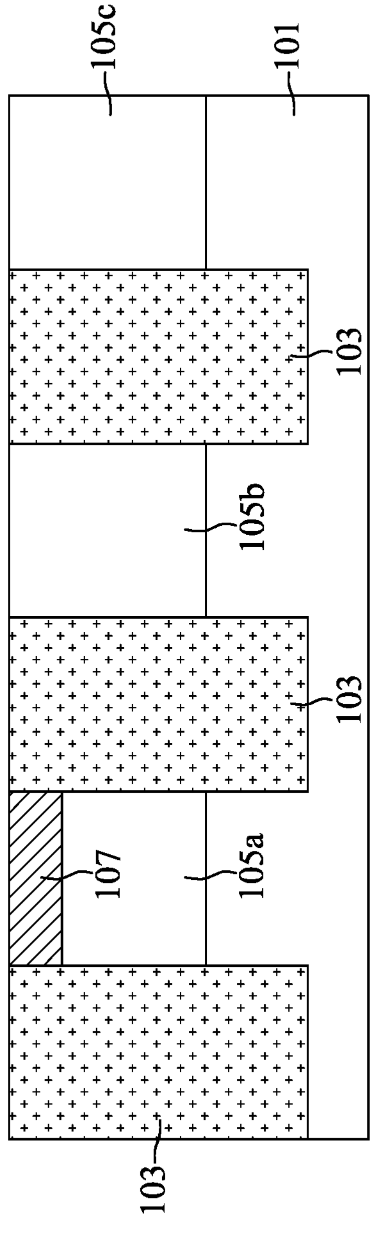
FIG. 5 is a cross-sectional view illustrating an intermediate stage of forming a bit line contact in the semiconductor substrate during the formation of the memory device, in accordance with some embodiments.

After the isolation structures 103 and the doped regions 105*a*, 105*b* and 105*c* are formed, a bit line contact 107 is formed in the semiconductor substrate 101, as shown in FIG. 5 in accordance with some embodiments. In some embodiments, the bit line contact 107 is formed in the doped region 105*a*. In some embodiments, the bit line contact 107 includes doped polysilicon, metal, metal silicide or another applicable conductive material, and the formation of the bit line contact 107 include forming a patterned mask (not shown) over the semiconductor substrate 101, etching the semiconductor substrate 101 to form an opening (not shown) by using the patterned mask as a mask, depositing a conductive material in the opening and over the semiconductor substrate 101, and planarizing the conductive material until the semiconductor substrate 101 is exposed.

Figure 6:
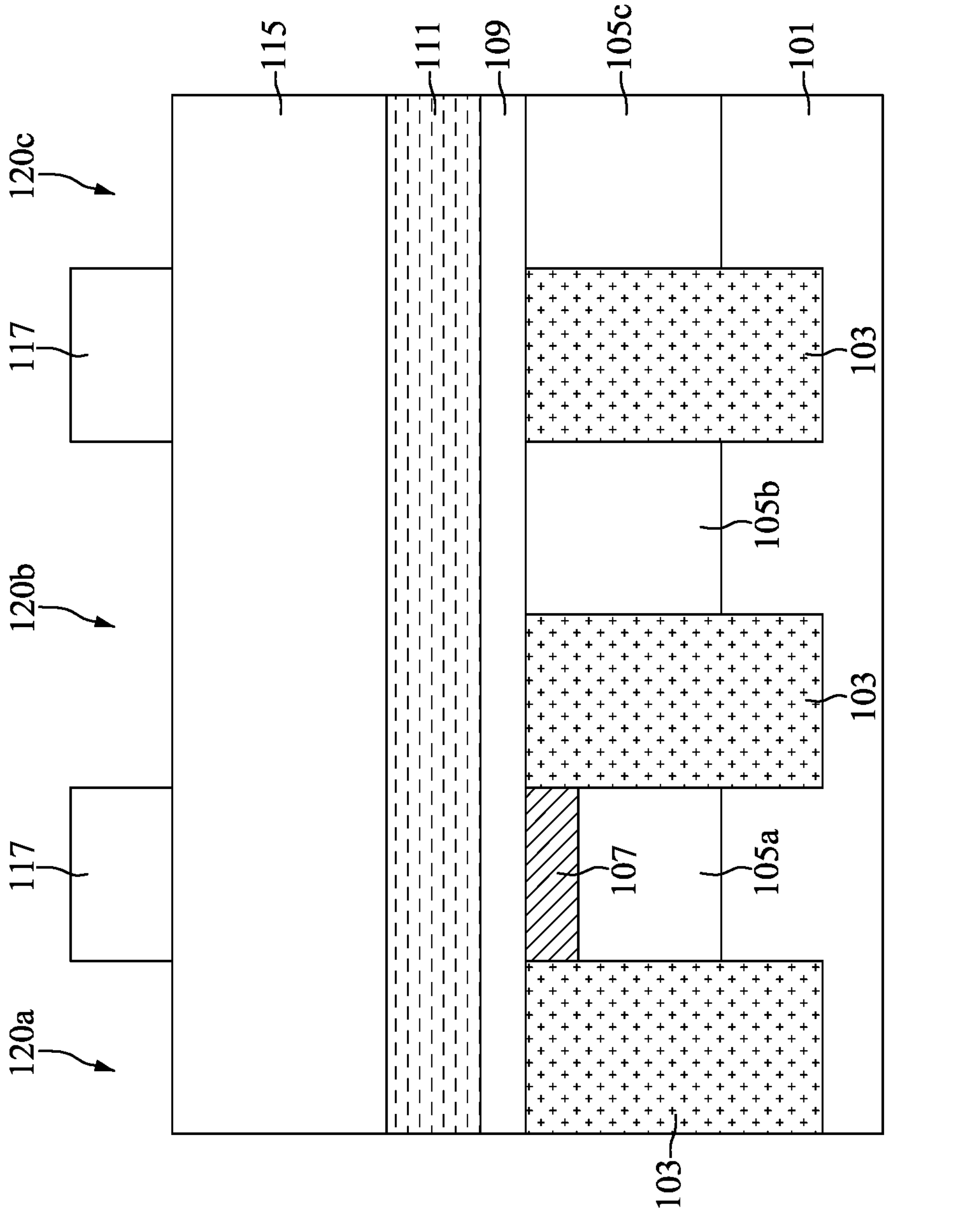
FIG. 6 is a cross-sectional view illustrating an intermediate stage of sequentially forming a lower bit line material, an upper bit line material, and a bit line mask material over the semiconductor substrate during the formation of the memory device, in accordance with some embodiments.

Next, a lower bit line material 109, an upper bit line material 111, a bit line mask material 115 and a patterned mask 117 are sequentially formed over the semiconductor substrate 101, as shown in FIG. 6 in accordance with some embodiments. In some embodiments, the patterned mask 117 has openings 120*a*, 120*b* and 120*c* exposing the bit line mask material 115. In some embodiments, the lower bit line material 109 includes titanium nitride (TiN), tantalum nitride (TaN), tantalum carbide (TaC), and titanium carbide (TiC), or another suitable conductive material.

In some embodiments, the upper bit line material 111 includes tungsten (W), titanium (Ti), nickel (Ni), cobalt (Co), or a combination thereof. In some embodiments, the bit line mask material 115 includes silicon nitride. However, the material is merely exemplary. Any other suitable materials may alternatively be used to from the bit line mask material 115. In some embodiments, the bit line mask material 115 and the patterned mask 117 include different materials so that the etching selectivities may be different in the subsequent etching process.

In addition, the lower bit line material 109 is formed by a deposition process, such as a chemical vapor deposition (CVD) process, a physical vapor deposition (PVD) process, an atomic layer deposition (ALD) process, a spin-on coating process, a sputtering process, or another suitable deposition process, in accordance with some embodiments. Some processes used to form the upper bit line material 111 and the bit line mask material 115 are similar to, or the same as, those used to form the lower bit line material 109, and details thereof are not repeated herein.

Figure 7:
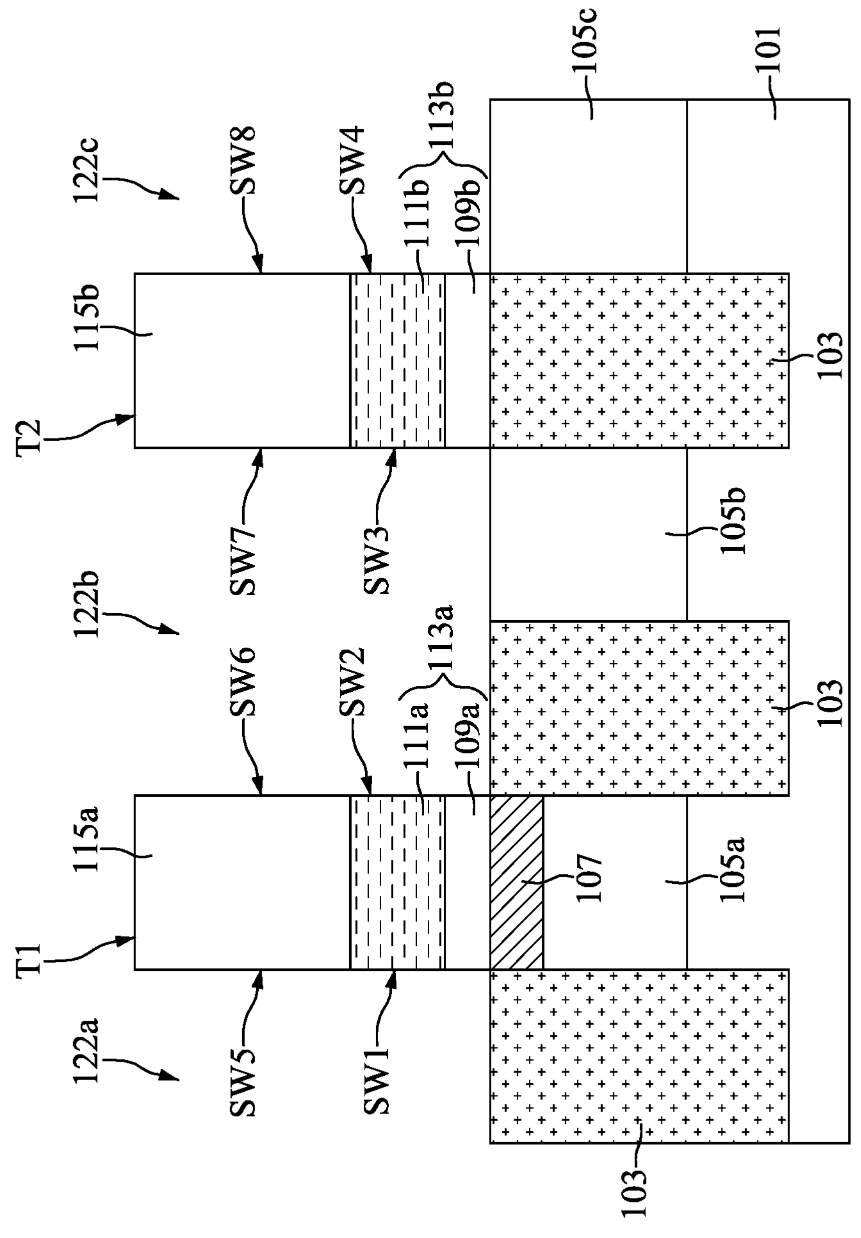
FIG. 7 is a cross-sectional view illustrating an intermediate stage of etching the lower bit line material, the upper bit line material, and the bit line mask material to form bit line structures and bit line mask layers during the formation of the memory device, in accordance with some embodiments.

Subsequently, an etching process is performed using the patterned mask 117 as an etching mask, such that bit line structures 113*a* and 113*b* are formed, as shown in FIG. 7 in accordance with some embodiments. The respective step is illustrated as the step S11 in the method 10 shown in FIG. 2. In some embodiments, openings 122*a*, 122*b* and 122*c* are formed penetrating through the bit line mask material 115, the upper bit line material 111, and the lower bit line material 109. After the etching process is performed, the bit line structures 113*a* and 113*b* are separated from each other, and the bit line structures 113*a* and 113*b* are covered by the remaining portions of the bit line mask material 115, and the remaining portions of the bit line mask material 115 are referred to as bit line mask layers 115*a* and 115*b*.

In some embodiments, the bit line structure 113*a* includes a lower bit line layer 109*a* and an upper bit line layer 111*a*, and the bit line structure 113*a* is covered by the bit line mask layer 115*a*. In some embodiments, the bit line structure 113*b* includes a lower bit line layer 109*b* and an upper bit line layer 111*b*, and the bit line structure 113*b* is covered by the bit line mask layer 115*b*.

Moreover, the sidewall SW1 of the bit line structure 113*a* and the sidewall SW5 of the bit line mask layer 115*a* are exposed by the opening 122*a*, in accordance with some embodiments. In some embodiments, the sidewall SW2 of the bit line structure 113*a*, the sidewall SW6 of the bit line mask layer 115*a*, the sidewall SW3 of the bit line structure 113*b*, and the sidewall SW7 of the bit line mask layer 115*b* are exposed by the opening 122*b*. In some embodiments, the sidewall SW4 of the bit line structure 113*b* and the sidewall SW8 of the bit line mask layer 115*b* are exposed by the opening 122*c*.

In some embodiments, the etching process for forming the bit line structures 113*a*, 113*b* and the bit line mask layers 115*a*, 115*b* includes a wet etching process, a dry etching process, or a combination thereof. After the bit line structures 113*a* and 113*b* are formed, the patterned mask 117 may be removed, and the top surfaces T1 and T2 of the bit line mask layers 115*a* and 115*b* are exposed. In some embodiments, the patterned mask 117 is removed by an ashing process or a wet etching process.

Figure 8:
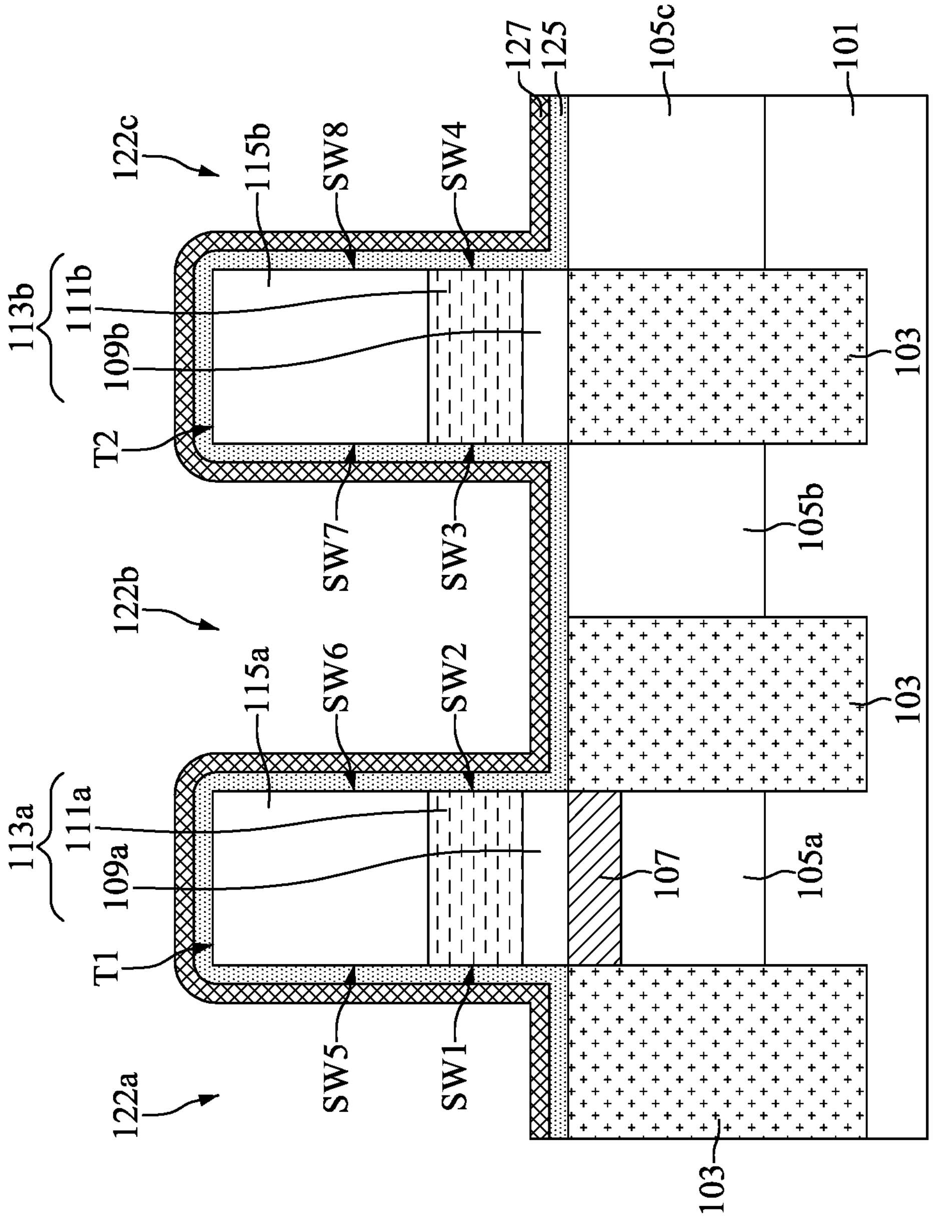
FIG. 8 is a cross-sectional view illustrating an intermediate stage of sequentially forming a first spacer material and a sacrificial material covering the bit line mask layers and the semiconductor substrate during the formation of the memory device, in accordance with some embodiments.

Then, a first spacer material 125 and a sacrificial material 127 are sequentially formed on the structure of FIG. 7, in accordance with some embodiments. In some embodiments, as shown in FIG. 8, the first spacer material 125 and the sacrificial material 127 are conformally deposited over the bit line mask layers 115*a*, 115*b* and lining the openings 122*a*, 122*b* and 122*c*. In some embodiments, the sidewalls SW1, SW2 of the bit line structure 113*a*, the sidewalls SW3, SW4 of the bit line structure 113*b*, the top surface T1 and the sidewalls SW5, SW6 of the bit line mask layer 115*a*, the top surface T2 and the sidewalls SW7, SW8 of the bit line mask layer 115*b*, and the top surface of the semiconductor substrate 101 are covered by the first spacer material 125. In some embodiments, the first spacer material 125 is covered by the sacrificial material 127.

In some embodiments, the first spacer material 125 and the sacrificial material 127 include different materials. In some embodiments, the first spacer material 125 includes silicon nitride, and the sacrificial material 127 includes silicon oxide. In some embodiments, the first spacer material 125 and the sacrificial material 127 are formed by deposition processes, such as CVD, PVD, ALD, spin-on coating, or another suitable process.

Figure 9:
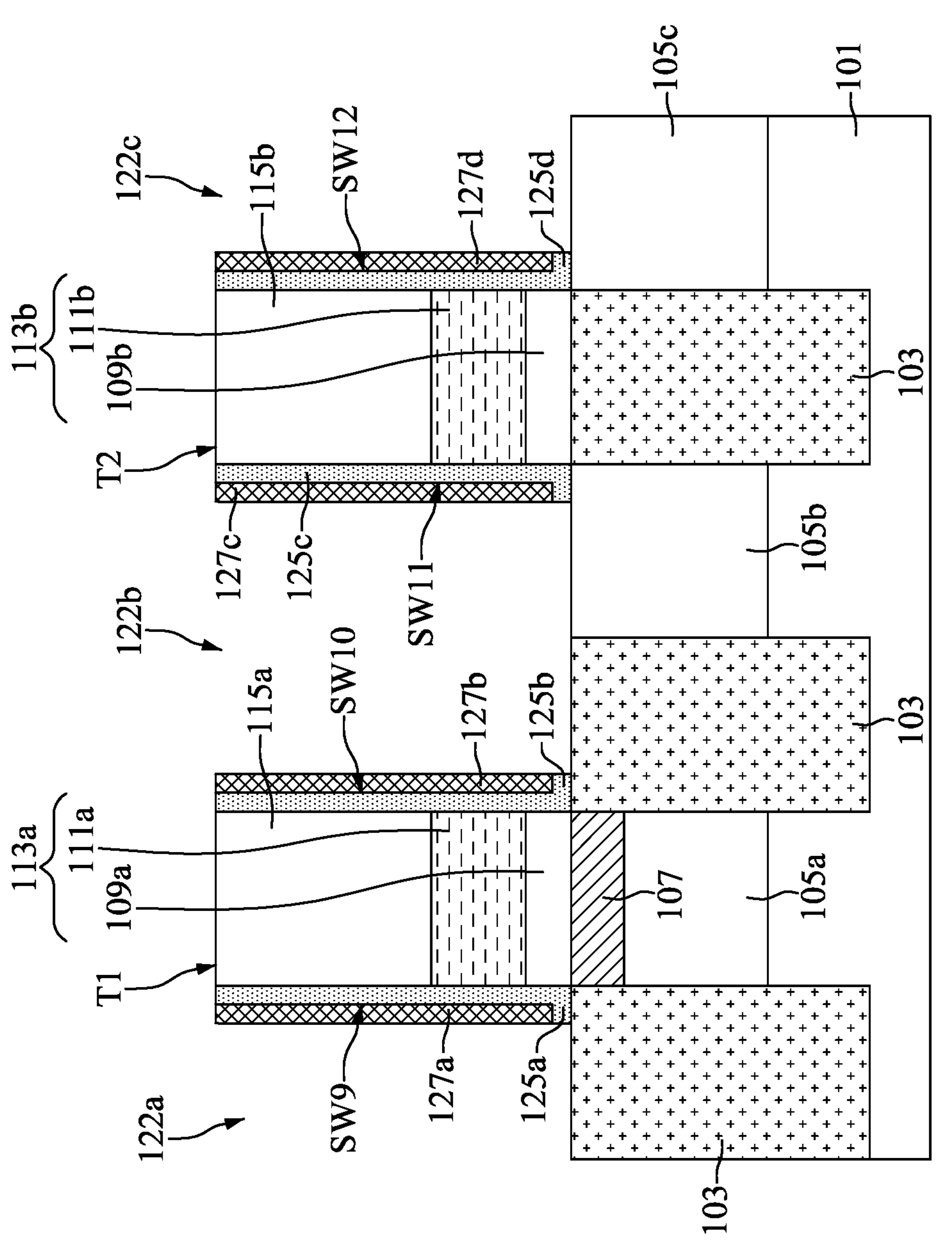
FIG. 9 is a cross-sectional view illustrating an intermediate stage of partially removing the first spacer material and the sacrificial material to form first spacer layers and sacrificial layers on sidewalls of the bit line structures and sidewalls of the bit line mask layers during the formation of the memory device, in accordance with some embodiments.

Next, an etching process is performed on the first spacer material 125 and the sacrificial material 127 to remove the horizontal portions of the first spacer material 125 and the sacrificial material 127, leaving the vertical portions of the first spacer material 125 and the sacrificial material 127, as shown in FIG. 9 in accordance with some embodiments. The remaining vertical portions of the first spacer material 125 and the sacrificial material 127 are referred to as first spacer layers 125*a*, 125*b*, 125*c*, 125*d* and sacrificial layers 127*a*, 127*b*, 127*c*, 127*d*. In some embodiments, the etching process is an anisotropic etching process.

In some embodiments, the first spacer layer 125*a* is disposed on the sidewall SW1 of the bit line structure 113*a* and the sidewall SW5 of the bit line mask layer 115*a*, the first spacer layer 125*b* is disposed on the sidewall SW2 of the bit line structure 113*a* and the sidewall SW6 of the bit line mask layer 115*a*, the first spacer layer 125*c* is disposed on the sidewall SW3 of the bit line structure 113*b* and the sidewall SW7 of the bit line mask layer 115*b*, and the first spacer layer 125*d* is disposed on the sidewall SW4 of the bit line structure 113*b* and the sidewall SW8 of the bit line mask layer 115*b*. Moreover, in some embodiments, the sacrificial layer 127*a* is disposed on the sidewall SW9 of the first spacer layer 125*a*, the sacrificial layer 127*b* is disposed on the sidewall SW10 of the first spacer layer 125*b*, the sacrificial layer 127*c* is disposed on the sidewall SW11 of the first spacer layer 125*c*, and the sacrificial layer 127*d* is disposed on the sidewall SW12 of the first spacer layer 125*d*. After the etching process is performed, the top surface T1 of the bit line mask layer 115*a* and the top surface T2 of the bit line mask layer 115*b* are exposed, in accordance with some embodiments.

Figure 10:
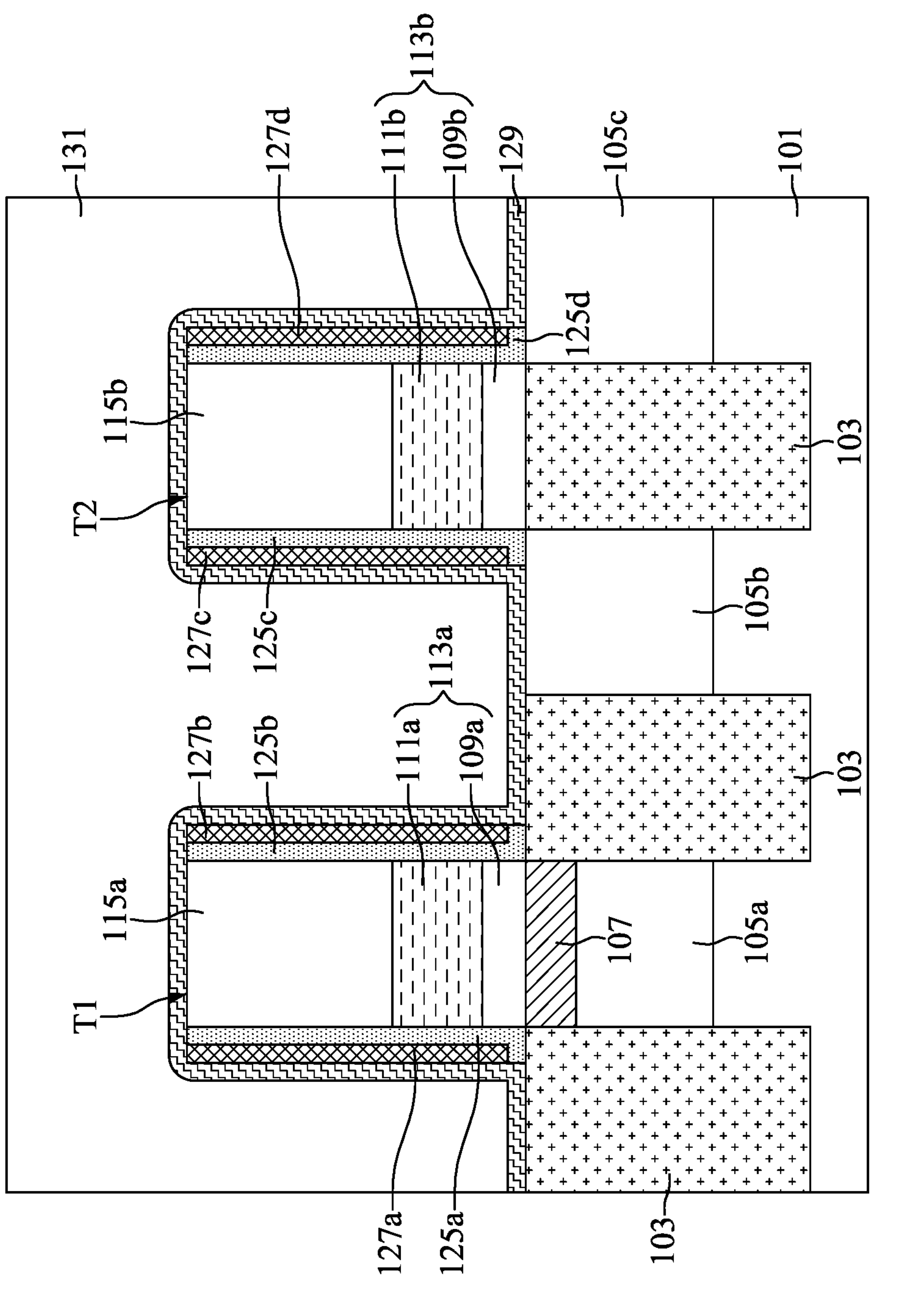
FIG. 10 is a cross-sectional view illustrating an intermediate stage of sequentially forming a second spacer material and a dielectric layer covering the semiconductor substrate, the first spacer layers, the sacrificial layers, and the semiconductor substrate during the formation of the memory device, in accordance with some embodiments.

Subsequently, a second spacer material 129 is formed over the structure of FIG. 9, and a dielectric layer 131 is formed over the second spacer material 129, as shown in FIG. 10 in accordance with some embodiments. In some embodiments, the second spacer material 129 is formed covering the bit line mask layers 115*a*, 115*b*, the first spacer layers 125*a*, 125*b*, 125*c*, 125*d*, and the sacrificial layers 127*a*, 127*b*, 127*c*, 127*d*, and lining the openings 122*a*, 122*b* and 122*c* (see FIG. 9). In some embodiments, the remaining portions of the openings 122*a*, 122*b*, 122*c* are filled by the dielectric layer 131, and the dielectric layer 131 extends over the bit line mask layers 115*a* and 115*b*.

In some embodiments, the second spacer material 129 and the sacrificial material 127 include different materials. In some embodiments, the second spacer material 129 includes silicon nitride, and the sacrificial material 127 includes silicon oxide. In some embodiments, the dielectric layer 131 includes silicon oxide, silicon nitride, silicon oxynitride or another applicable dielectric material. In some embodiments, the second spacer material 129 and the dielectric layer 131 are formed by deposition processes, such as CVD, PVD, ALD, spin-on coating, or another suitable process.

Figure 11:
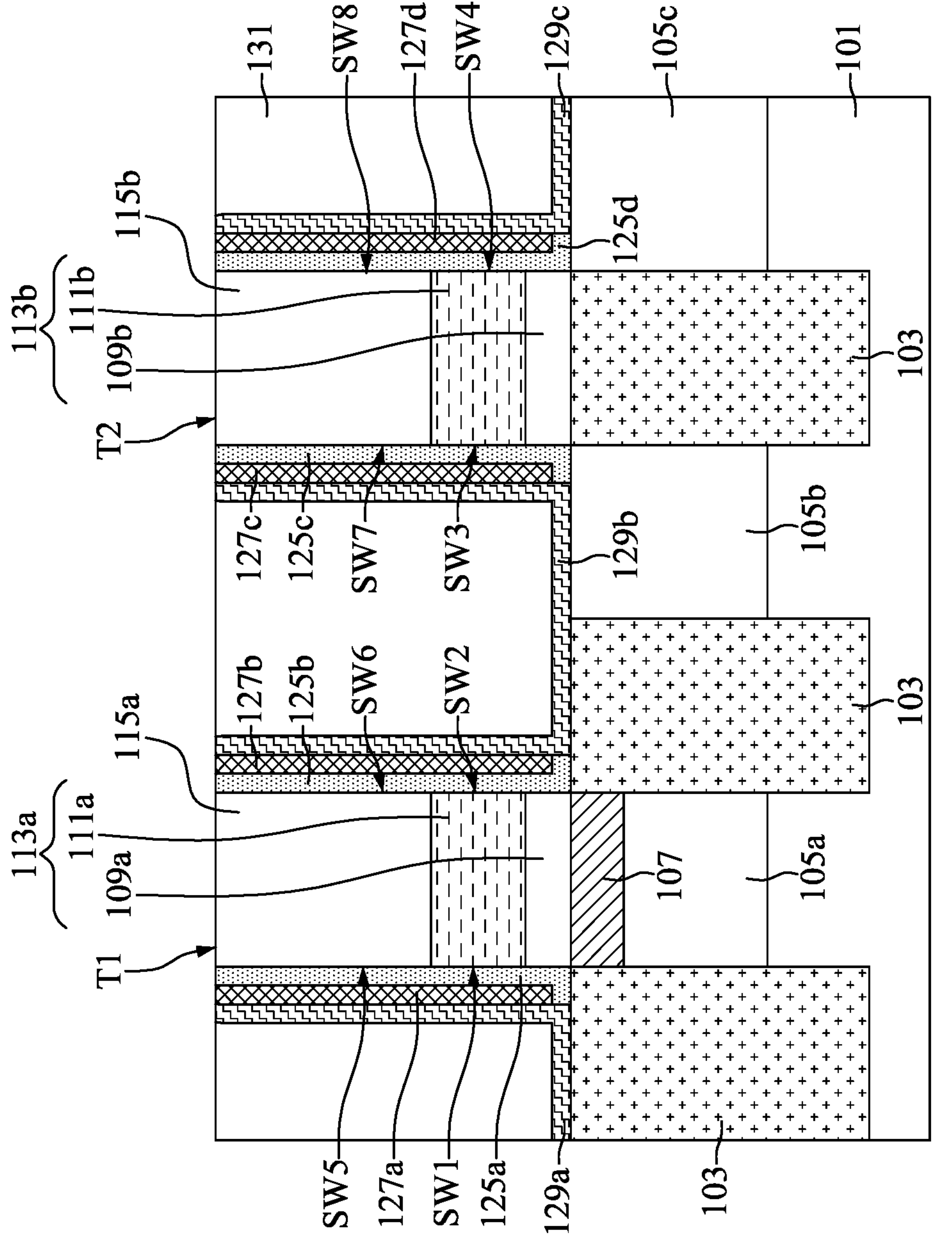
FIG. 11 is a cross-sectional view illustrating an intermediate stage of planarizing the second spacer material and the dielectric layer to form second spacer layers and to expose the bit line mask layers during the formation of the memory device, in accordance with some embodiments.

Then, a planarization process is performed to expose the bit line mask layers 115*a* and 115*b*, as shown in FIG. 11 in accordance with some embodiments. In some embodiments, the dielectric layer 131 and the second spacer material 129 are partially removed by the planarization process, and the remaining portions of the second spacer material 129 are referred to as second spacer layers 129*a*, 129*b* and 129*c*. In some embodiments, the planarization process includes a chemical mechanical polishing (CMP) process.

After the planarization process is performed, the top surface T1 of the bit line mask layer 115*a* and the top surface T2 of the bit line mask layer 115*b* are exposed. In some embodiments, the first spacer layer 125*a*, the sacrificial layer 127*a* and the second spacer layer 129*a* are disposed on the sidewall SW1 of the bit line structure 113*a* and the sidewall SW5 of the bit line mask layer 115*a*. In some embodiments, the first spacer layer 125*b*, the sacrificial layer 127*b* and a portion of the second spacer layer 129*b* are disposed on the sidewall SW2 of the bit line structure 113*a* and the sidewall SW6 of the bit line mask layer 115*a*. In some embodiments, the first spacer layer 125*c*, the sacrificial layer 127*c* and a portion of the second spacer layer 129*b* are disposed on the sidewall SW3 of the bit line structure 113*b* and the sidewall SW7 of the bit line mask layer 115*b*. In some embodiments, the first spacer layer 125*d*, the sacrificial layer 127*d* and the second spacer layer 129*c* are disposed on the sidewall SW4 of the bit line structure 113*b* and the sidewall SW8 of the bit line mask layer 115*b*. The respective step is illustrated as the step S13 in the method 10 shown in FIG. 2.

Figure 12:
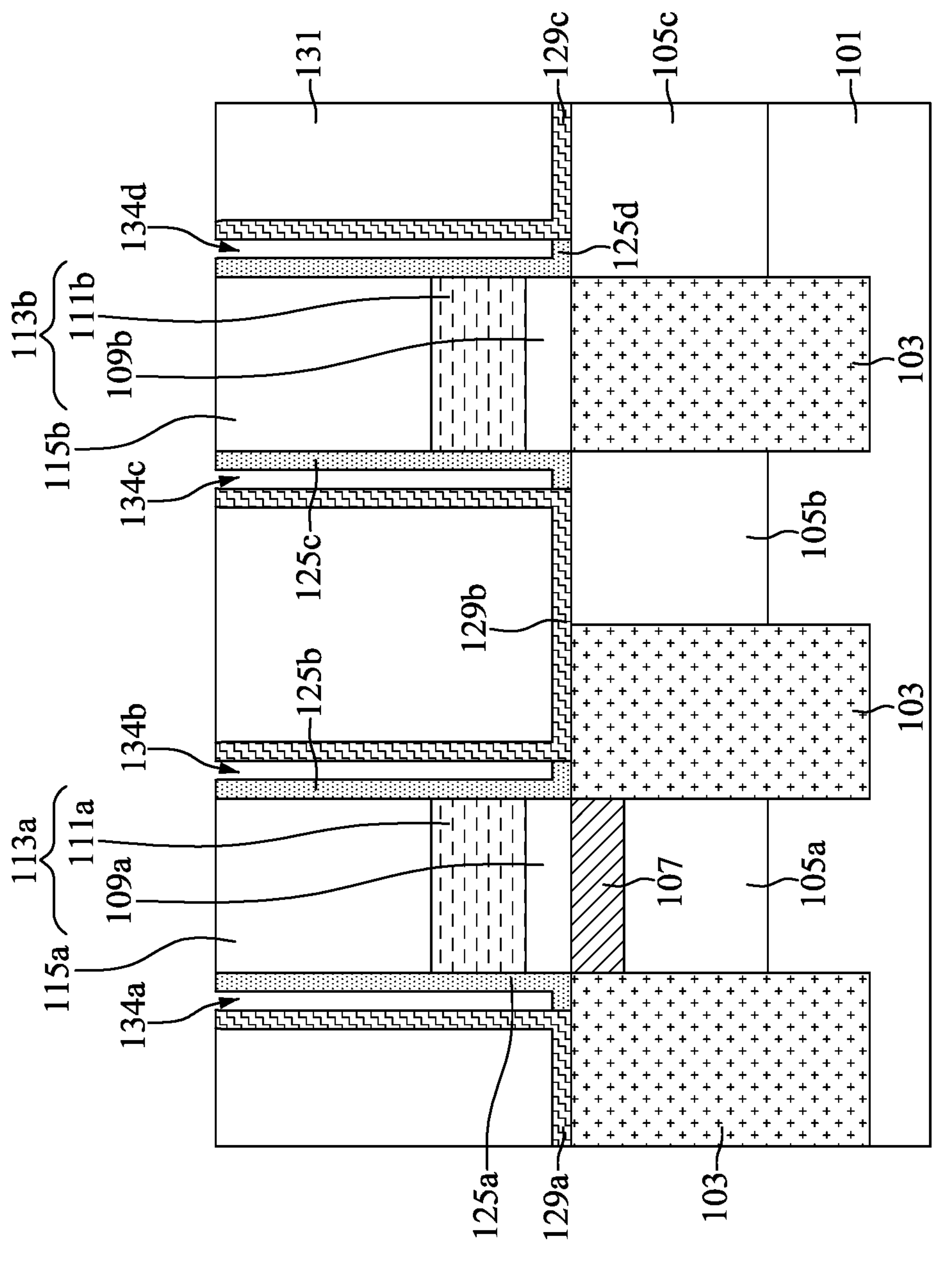
FIG. 12 is a cross-sectional view illustrating an intermediate stage of removing the sacrificial layers to form air gaps during the formation of the memory device, in accordance with some embodiments.

Next, the sacrificial layers 127*a*, 127*b*, 127*c* and 127*d* are removed to form air gaps 134*a*, 134*b*, 134*c* and 134*d*, as shown in FIG. 12 in accordance with some embodiments. The respective step is illustrated as the step S15 in the method 10 shown in FIG. 2. In some embodiments, the dielectric layer 131 includes a material different from that of the sacrificial layers 127*a*, 127*b*, 127*c*, 127*d*, such that an etching selectivity exists between them. For example, the sacrificial layers 127*a*, 127*b*, 127*c*, 127*d* include a doped oxide material such as borophosphosilicate glass (BPSG), and the dielectric layer 131 includes a CVD oxide material, which is denser than the doped oxide material. In some embodiments, the sacrificial layers 127*a*, 127*b*, 127*c* and 127*d* are removed by an etching process such as a dry etching process or a wet etching process.

Figure 13:
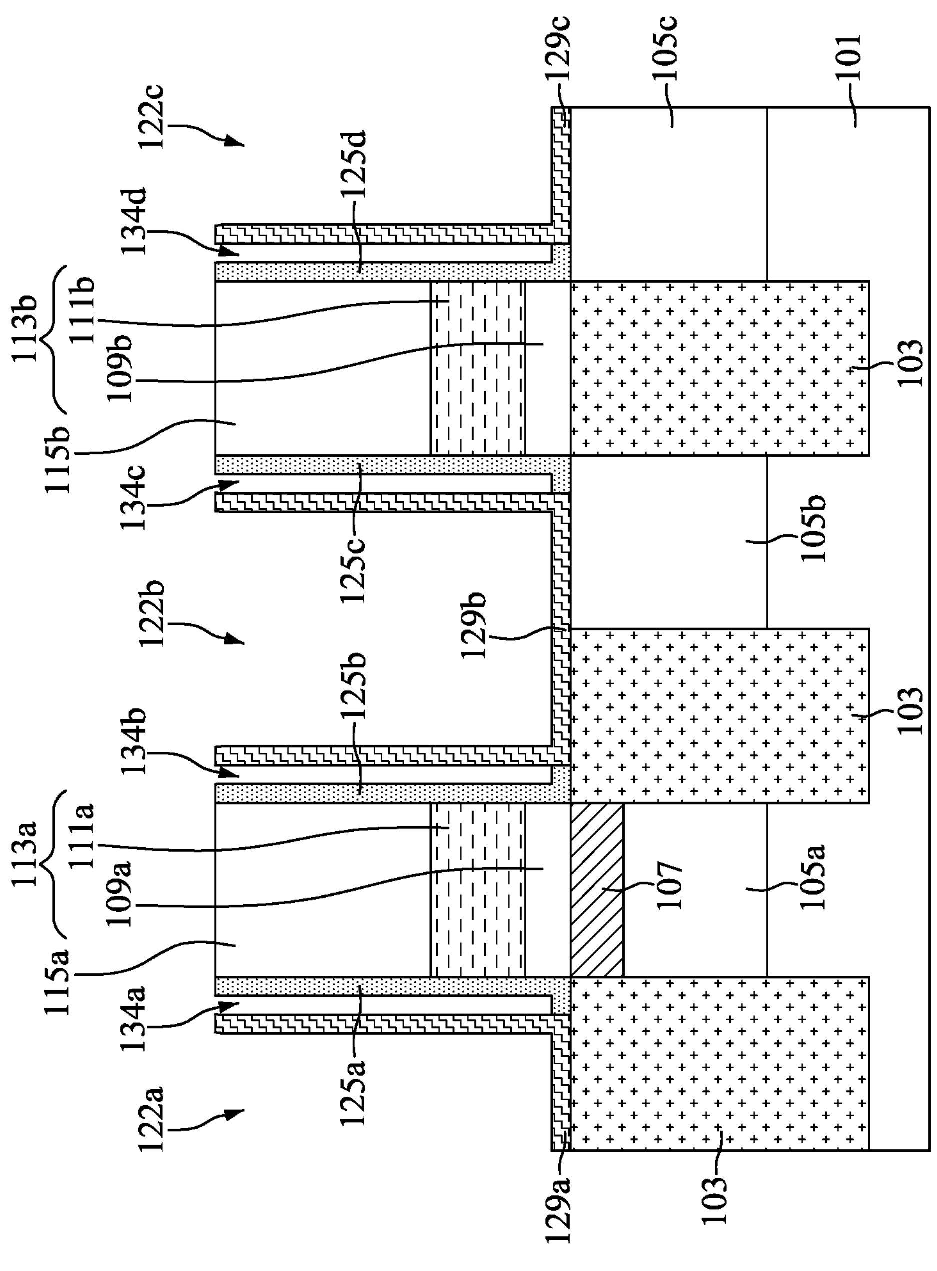
FIG. 13 is a cross-sectional view illustrating an intermediate stage of removing the dielectric layer during the formation of the memory device, in accordance with some embodiments.

After the sacrificial layers 127*a*, 127*b*, 127*c* and 127*d* are removed, the dielectric layer 131 is removed, as shown in FIG. 13 in accordance with some embodiments. In some embodiments, the dielectric layer 131 is removed by an etching process such as a wet etching process. After the dielectric layer 131 is removed, the second spacer layers 129*a*, 129*b* and 129*c* are exposed by the openings 122*a*, 122*b* and 122*c*, respectively.

Figure 14:
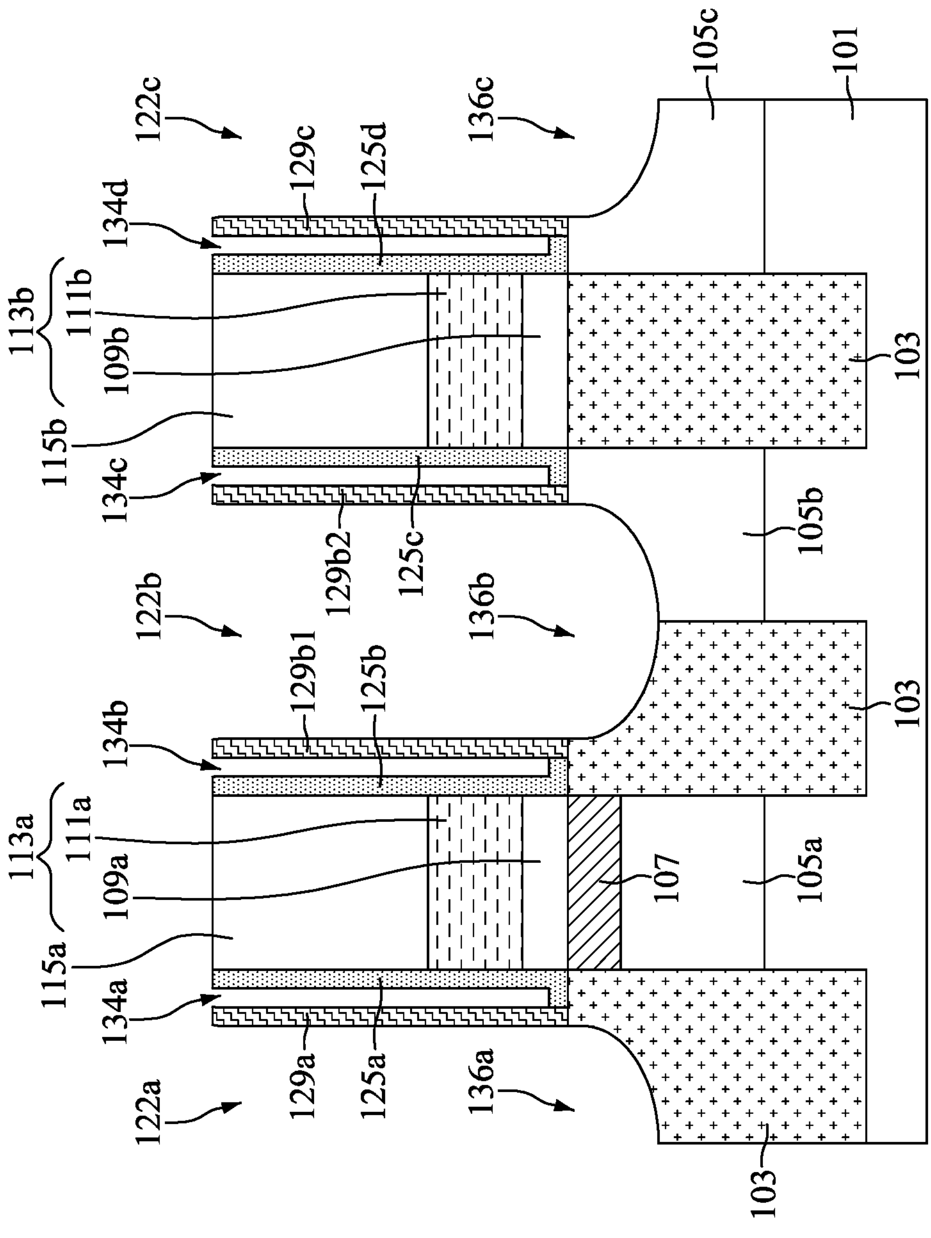
FIG. 14 is a cross-sectional view illustrating an intermediate stage of etching the second spacer layers and the semiconductor substrate to form openings adjacent to the bit line structures during the formation of the memory device, in accordance with some embodiments.

Subsequently, an etching process is performed to remove the horizontal portions of the second spacer layers 129*a*, 129*b* and 129*c* such that the semiconductor substrate 101 is exposed, and openings 136*a*, 136*b* and 136*c* are formed in the semiconductor substrate 101 by further etching the semiconductor substrate 101, as shown in FIG. 14 in accordance with some embodiments. In some embodiments, the openings 136*a*, 136*b* and 136*c* are formed adjacent to the bit line structures 113*a* and 113*b* and below the openings 122*a*, 122*b* and 122*c*. The respective step is illustrated as the step S17 in the method 10 shown in FIG. 2.

In some embodiments, the horizontal portions of the second spacer layers 129*a*, 129*b* and 129*c* are removed by a dry etching process. In some embodiments, the semiconductor substrate 101 is etched by an etching process, which includes a dry etching process or a wet etching process. The remaining portions of the second spacer layers 129*a*, 129*b* and 129*c* are referred to as second spacer layers 129*a*, 129*b*1, 129*b*2 and 129*c*, as shown in FIG. 14.

Figure 15:
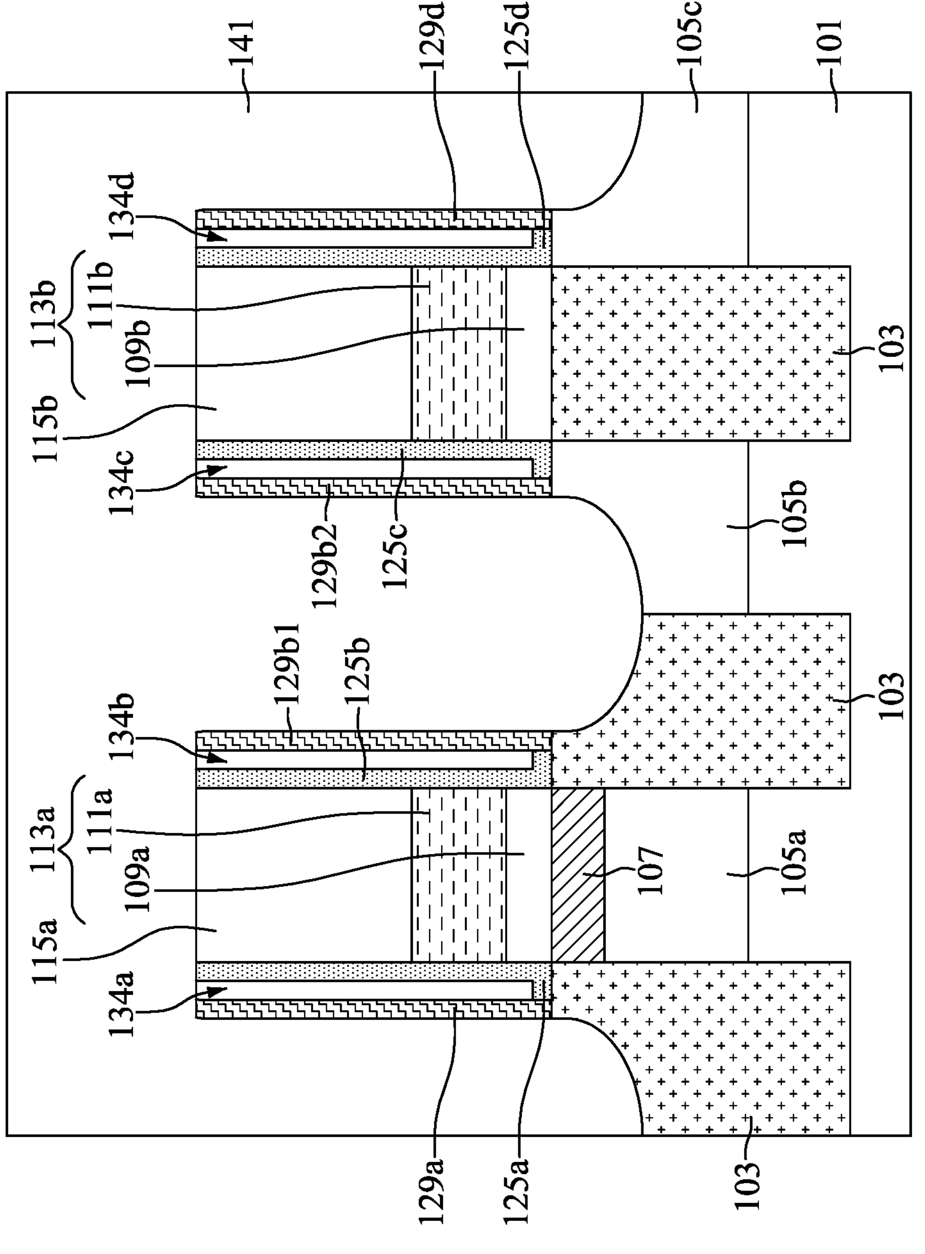
FIG. 15 is a cross-sectional view illustrating an intermediate stage of filling the openings with a lower capacitor contact layer during the formation of the memory device, in accordance with some embodiments.

Then, a lower capacitor contact layer 141 is formed over the structure of FIG. 14, and the openings 122*a*, 122*b*, 122*c*, 136*a*, 136*b* and 136*c* are filled by the lower capacitor contact layer 141, as shown in FIG. 15 in accordance with some embodiments. In some embodiments, the bit line mask layers 115*a*, 115*b*, the first spacer layers 125*a*, 125*b*, 125*c*, 125*d*, and the second spacer layers 129*a*, 129*b*1, 129*b*2, 129*c* are covered by the lower capacitor contact layer 141, and the air gaps 134*a*, 134*b*, 134*c* and 134*d* are sealed by the lower capacitor contact layer 141. The respective step is illustrated as the step S19 in the method 10 shown in FIG. 2. In some embodiments, the lower capacitor contact layer 141 includes polysilicon, and is formed by a deposition process, such as a CVD process, a PVD process, an ALD process, a spin-on coating process, or another suitable deposition process.

Figure 16:
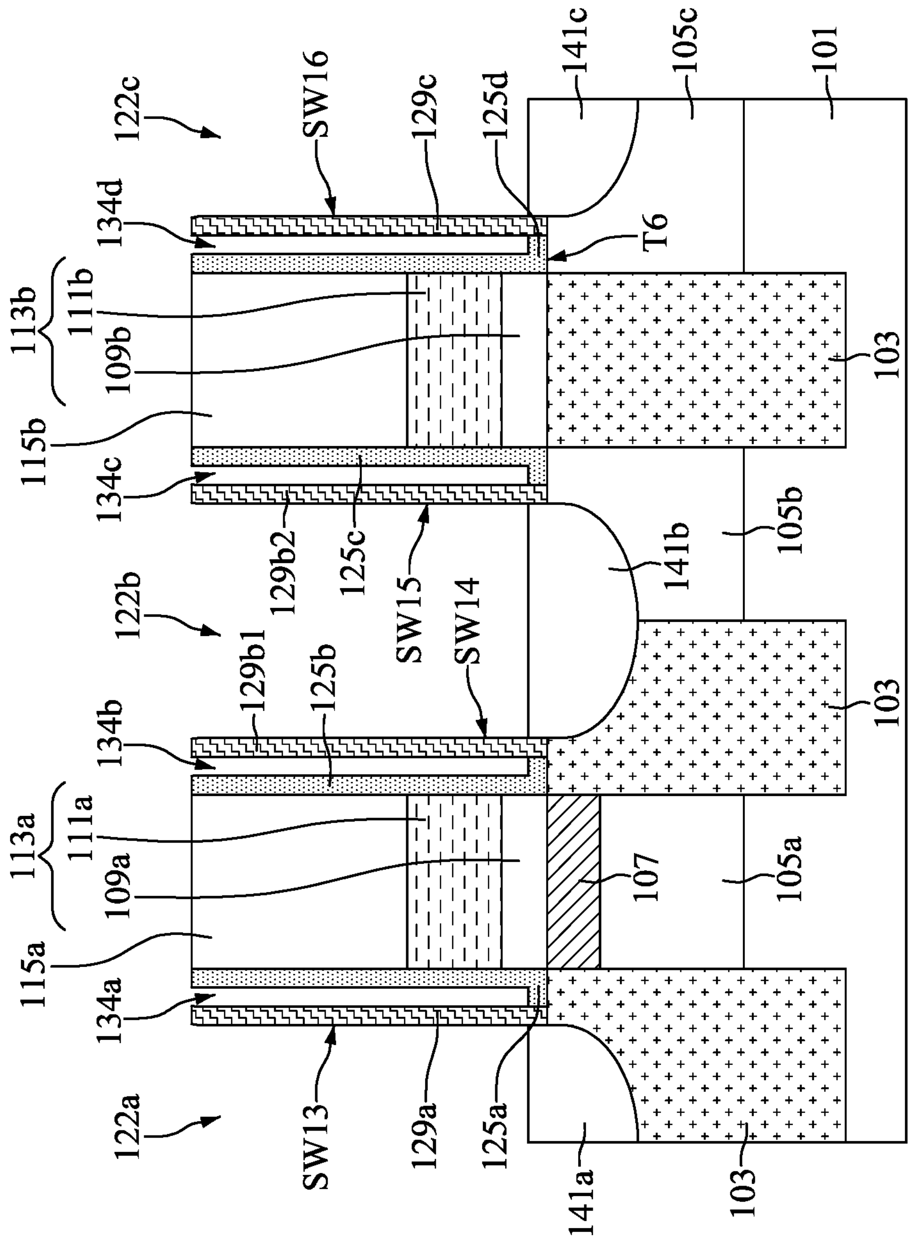
FIG. 16 is a cross-sectional view illustrating an intermediate stage of etching back the lower capacitor contact layer to form lower capacitor contacts during the formation of the memory device, in accordance with some embodiments.

Next, an etching back process is performed on the lower capacitor contact layer 141 to expose the sidewalls SW13, SW14, SW15 and SW16 of the second spacer layers 129*a*, 129*b*1, 129*b*2 and 129*c*, as shown in FIG. 16 in accordance with some embodiments. The remaining portions of the lower capacitor contact layer 141 are referred to as lower capacitor contacts 141*a*, 141*b* and 141*c*. The respective step is illustrated as the step S21 in the method 10 shown in FIG. 2. In some embodiments, the etching back process includes a dry etching process, a wet etching process, or a combination thereof.

Figure 17:
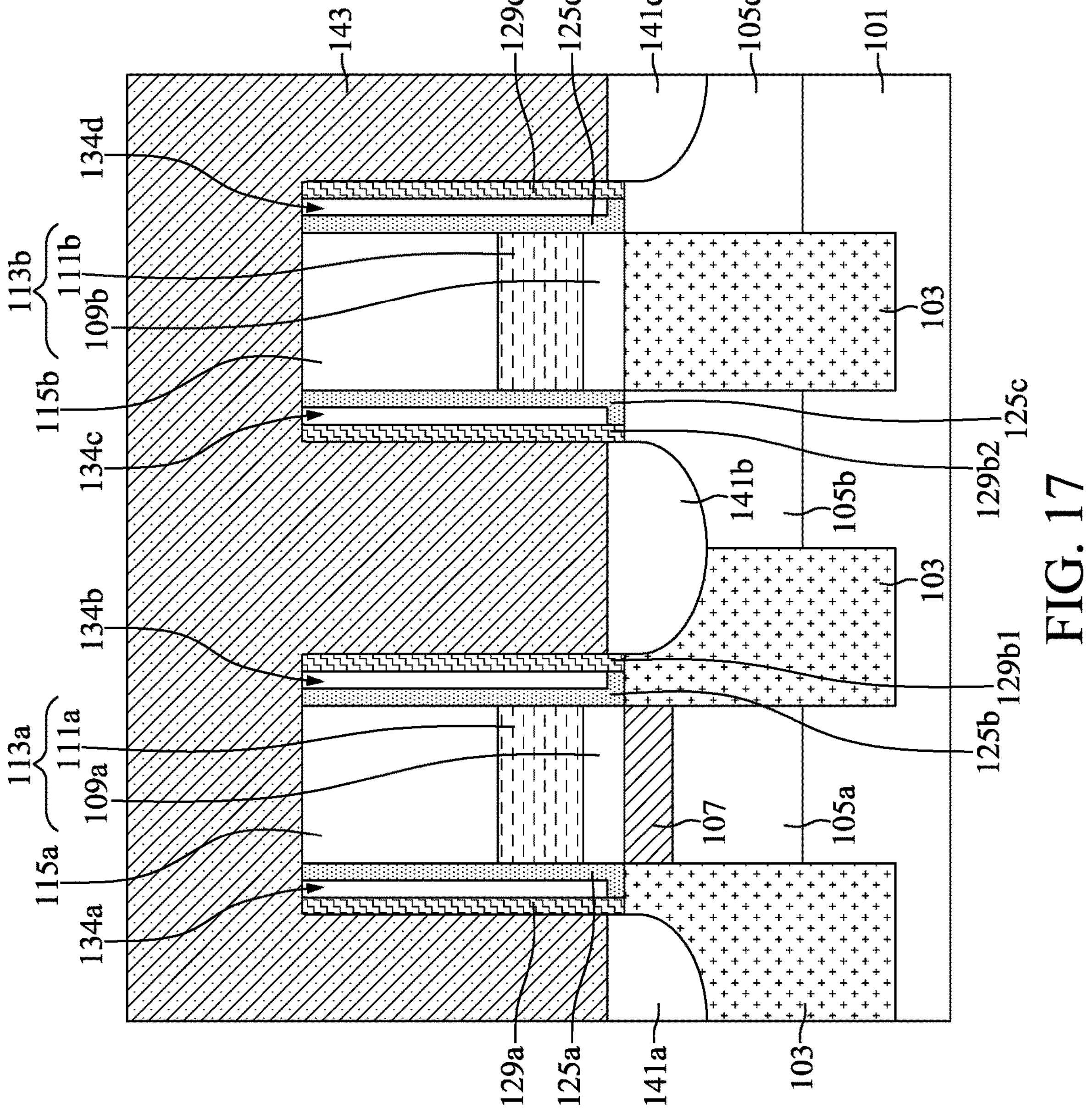
FIG. 17 is a cross-sectional view illustrating an intermediate stage of forming an upper capacitor contact layer over the lower capacitor contacts during the formation of the memory device, in accordance with some embodiments.

After the lower capacitor contacts 141*a*, 141*b* and 141*c* are formed, an upper capacitor contact layer 143 is formed over the structure of FIG. 16, and the openings 122*a*, 122*b*, 122*c* are filled by the upper capacitor contact layer 143, as shown in FIG. 17 in accordance with some embodiments. In some embodiments, the lower capacitor contacts 141*a*, 141*b*, 141*c*, the bit line mask layers 115*a*, 115*b*, the first spacer layers 125*a*, 125*b*, 125*c*, 125*d*, and the second spacer layers 129*a*, 129*b*1, 129*b*2, 129*c* are covered by the upper capacitor contact layer 143, and the air gaps 134*a*, 134*b*, 134*c* and 134*d* are sealed by the upper capacitor contact layer 143. The respective step is illustrated as the step S23 in the method 10 shown in FIG. 2. In some embodiments, the upper capacitor contact layer 143 includes titanium nitride (TiN), and is formed by a deposition process, such as a CVD process, a PVD process, an ALD process, a spin-on coating process, or another suitable deposition process.

Figure 18:
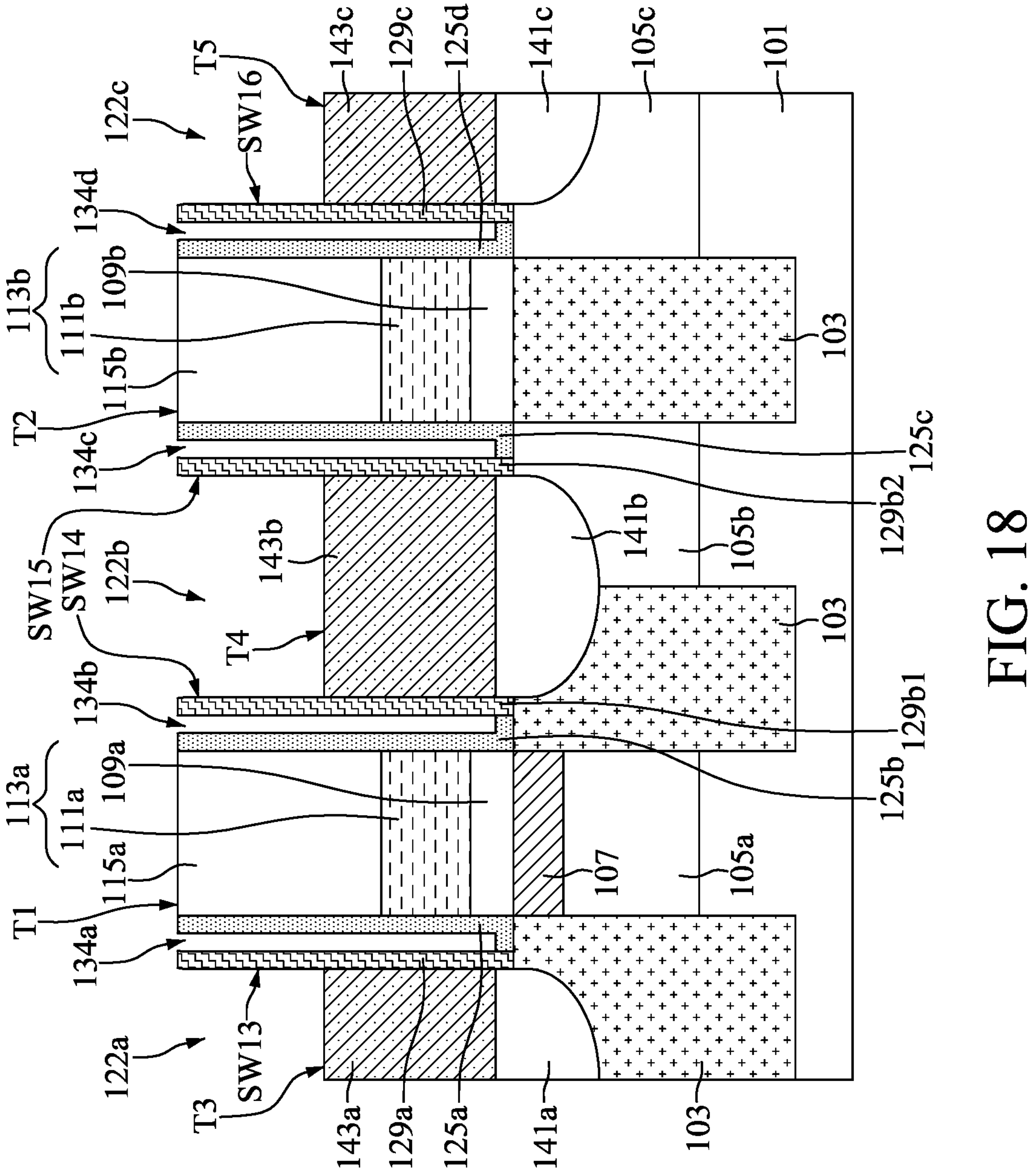
FIG. 18 is a cross-sectional view illustrating an intermediate stage of etching back the upper capacitor contact layer to form upper capacitor contacts during the formation of the memory device, in accordance with some embodiments.

Subsequently, an etching back process is performed on the upper capacitor contact layer 143 to expose the sidewalls SW13, SW14, SW15 and SW16 of the second spacer layers 129*a*, 129*b*1, 129*b*2 and 129*c*, as shown in FIG. 18 in accordance with some embodiments. The remaining portions of the upper capacitor contact layer 143 are referred to as upper capacitor contacts 143*a*, 143*b* and 143*c*. The respective step is illustrated as the step S25 in the method 10 shown in FIG. 2. In some embodiments, the etching back process includes a dry etching process, a wet etching process, or a combination thereof. After the upper capacitor contacts 143*a*, 143*b* and 143*c* are formed, the top surfaces T1 and T2 of the bit line mask layers 115*a* and 155*b* are higher than the top surfaces T3, T4 and T5 of the upper capacitor contacts 143*a*, 143*b* and 143*c*, in accordance with some embodiments.

Figure 19:
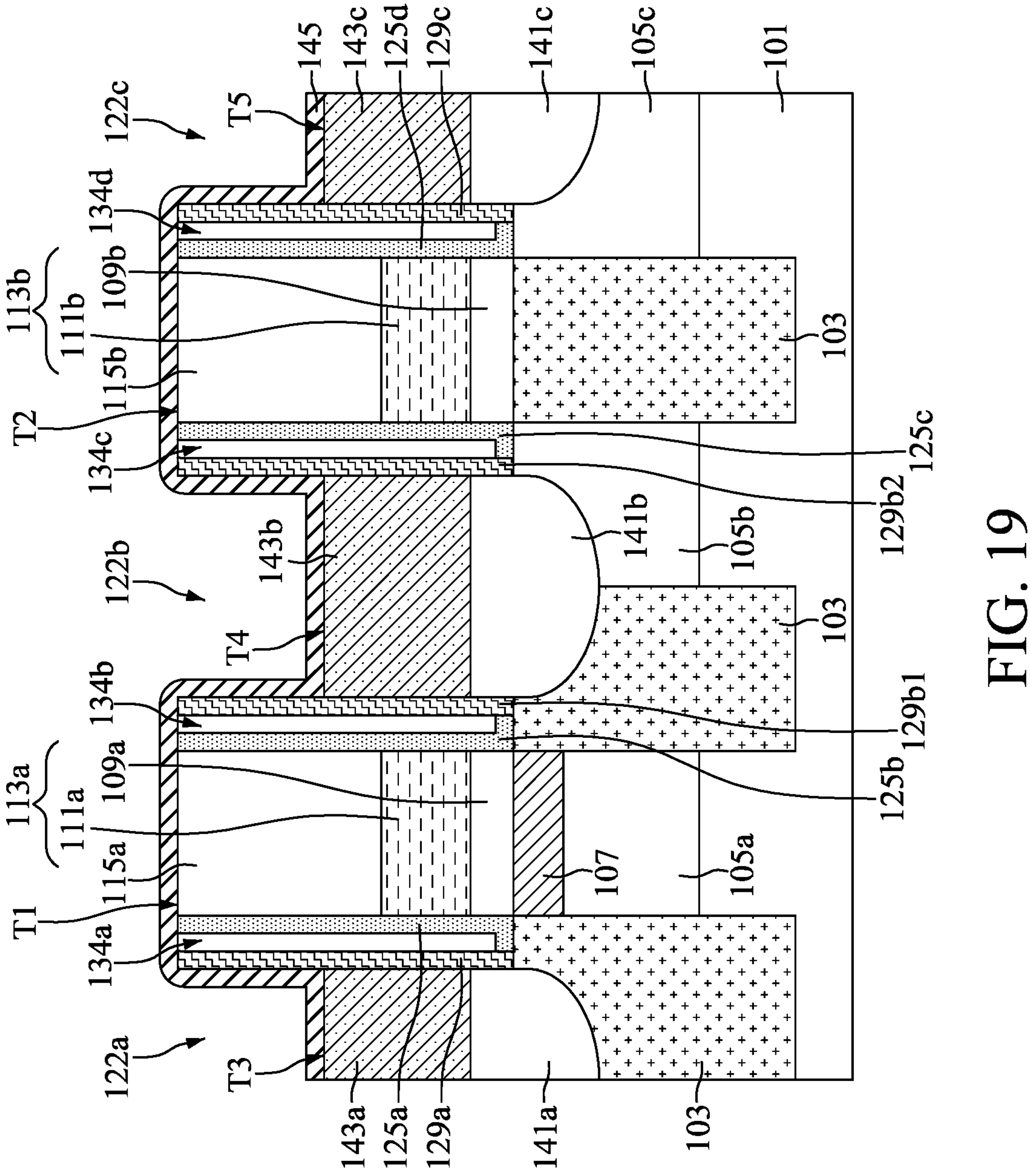
FIG. 19 is a cross-sectional view illustrating an intermediate stage of forming a third spacer material covering the bit line mask layers and the upper capacitor contacts during the formation of the memory device, in accordance with some embodiments.

After the upper capacitor contacts 143*a*, 143*b* and 143*c* are formed, a third spacer material 145 is formed over the structure of FIG. 18, in accordance with some embodiments. In some embodiments, as shown in FIG. 19, the top surfaces T1, T2 of the bit line mask layers 115*a*, 115*b*, and the top surfaces T3, T4, T5 of the upper capacitor contacts 143*a*, 143*b*, 143*c* are covered by the third spacer material 145. In some embodiments, the first spacer layers 125*a*, 125*b*, 125*c*, 125*d* and the second spacer layers 129*a*, 129*b*1, 129*b*2, 129*c* are covered by the third spacer material 145, and the air gaps 134*a*, 134*b*, 134*c*, 134*d* are sealed by the third spacer material 145. In some embodiments, the third spacer material 145 includes silicon nitride, and is formed by a deposition process, such as a CVD process, a PVD process, an ALD process, a spin-on coating process, in or a combination thereof.

Figure 20:
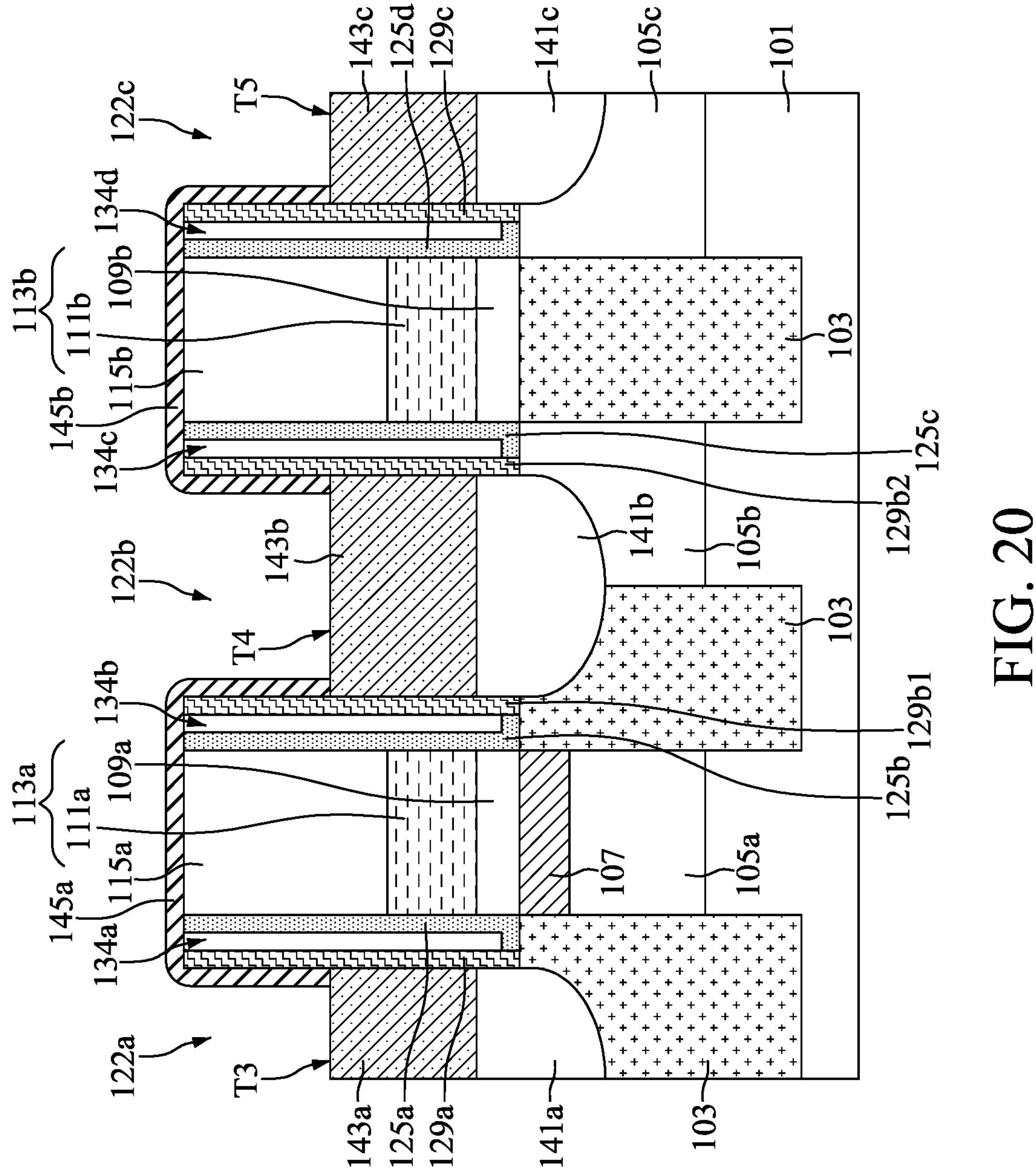
FIG. 20 is a cross-sectional view illustrating an intermediate stage of partially removing the third spacer material to form third spacer layers and to expose the upper capacitor contacts during the formation of the memory device, in accordance with some embodiments.

Then, an etching process is performed over the third spacer material 145 to expose the top surfaces T3, T4, T5 of the upper capacitor contacts 143*a*, 143*b*, 143*c*, as shown in FIG. 20 in accordance with some embodiments. In some embodiments, the remaining portions of the third spacer material 145 are referred to as third spacer layers 145*a* and 145*b*. In some embodiments, the etching process includes a dry etching process, a wet etching process, or a combination thereof.

In some embodiments, the bit line mask layer 115*a*, the first spacer layers 125*a*, 125*b*, and the second spacer layers 129*a*, 129*b*1 are covered by the third spacer layer 145*a*, and the air gaps 134*a*, 134*b* are sealed by the third spacer layer 145*a*. In some embodiments, the bit line mask layer 115*b*, the first spacer layers 125*c*, 125*d*, and the second spacer layers 129*b*2, 129*c* are covered by the third spacer layer 145*b*, and the air gaps 134*c*, 134*d* are sealed by the third spacer layer 145*b*. The respective step is illustrated as the step S27 in the method 10 shown in FIG. 2.

Next, a landing pad layer 147 is formed over the third spacer layers 145*a*, 145*b* and the upper capacitor contacts

Figure 21:
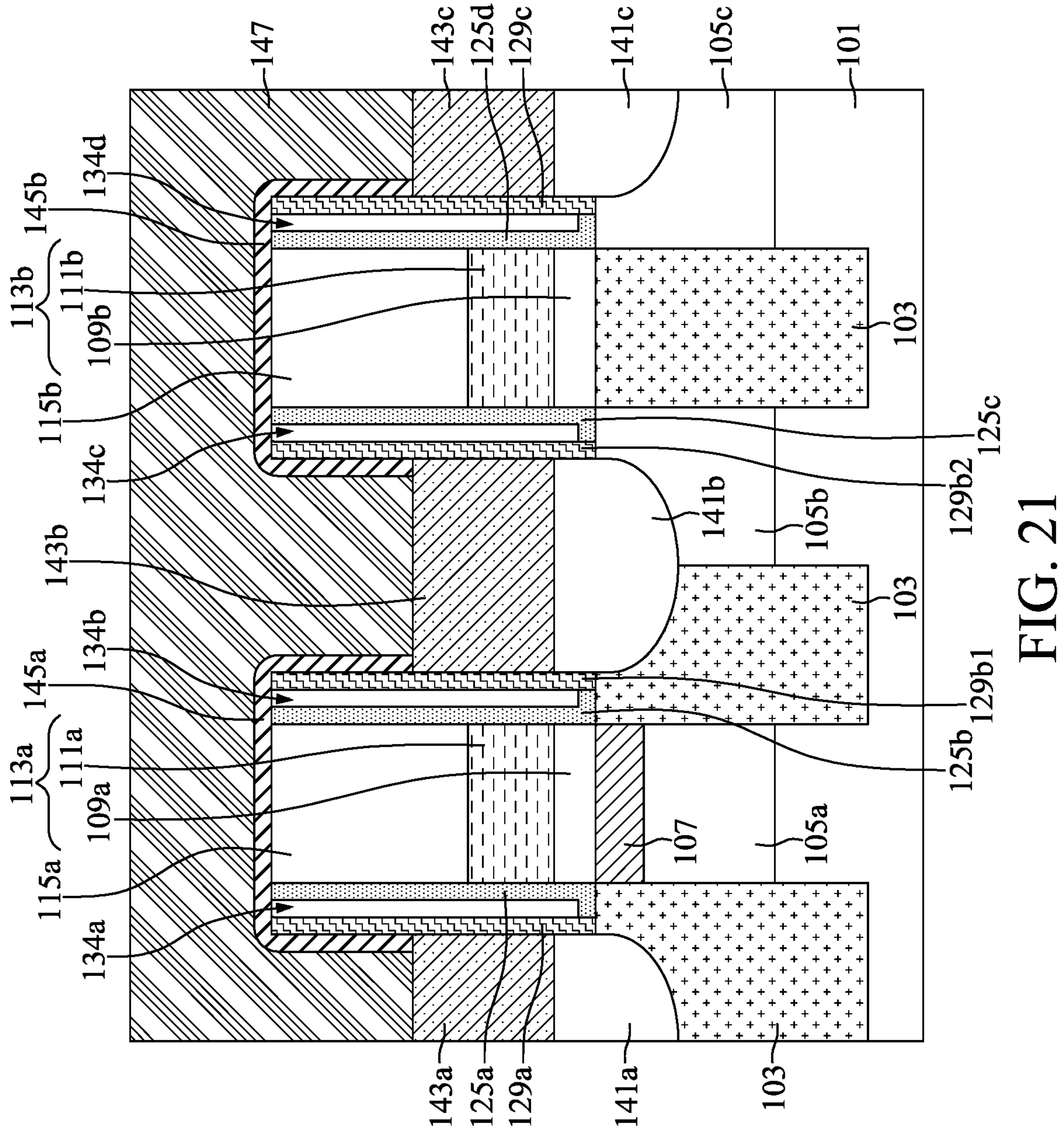
FIG. 21 is a cross-sectional view illustrating an intermediate stage of forming a landing pad layer covering the third spacer layers and the upper capacitor contacts during the formation of the memory device, in accordance with some embodiments.

143*a*, 143*b*, 143*c*, as shown in FIG. 21 in accordance with some embodiments. The respective step is illustrated as the step S29 in the method 10 shown in FIG. 2. In some embodiments, the landing pad layer 147 includes a conductive material, such as copper (Cu), tungsten (W), aluminum (Al), titanium (Ti), tantalum (Ta), gold (Au), silver (Ag). The landing pad layer 147 may be formed by a deposition process, such as a CVD process, a PVD process, a sputtering process, a plating process, or another suitable deposition process.

Figure 22:
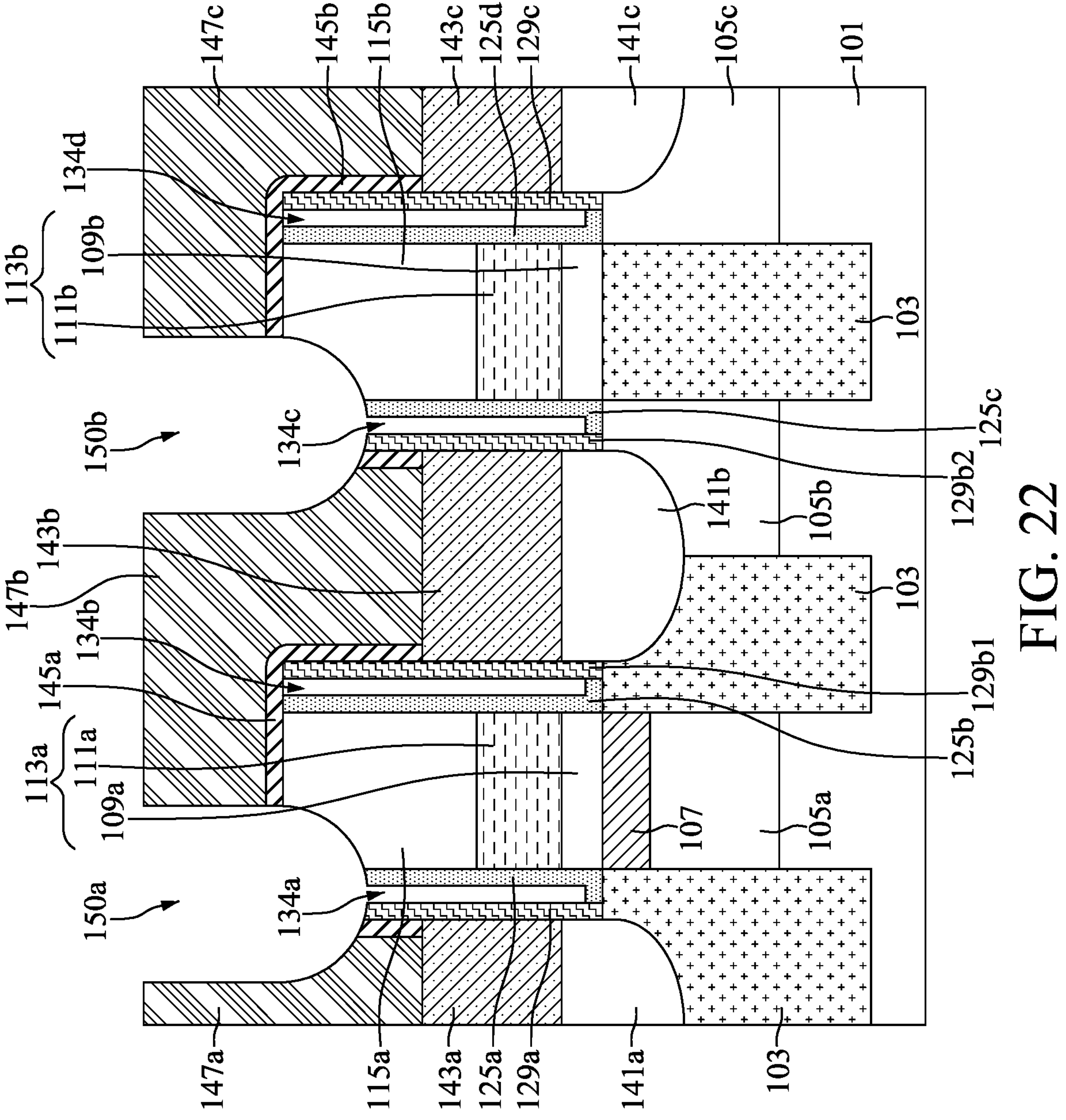
FIG. 22 is a cross-sectional view illustrating an intermediate stage of etching the landing pad layer, the first spacer layers, the second spacer layers, and the third spacer layers to form openings during the formation of the memory device, in accordance with some embodiments.

Subsequently, an etching process is performed to form openings 150*a* and 150*b*, as shown in FIG. 22 in accordance with some embodiments. In some embodiments, the landing pad layer 147, the first spacer layers 125*a*, 125*c*, the second spacer layers 129*a*, 129*b*2, the third spacer layers 145*a*, 145*b*, and the bit line mask layers 115*a*, 115*b* are partially removed. The remaining portions of the landing pad layer 147 are referred to as landing pads 147*a*, 147*b* and 147*c*. In some embodiments, the etching process includes a wet etching process, a dry etching process, or a combination thereof. The respective step is illustrated as the step S31 in the method 10 shown in FIG. 2.

Then, referring to FIG. 1, capacitors 159*a* and 159*b* are formed in the openings 150*a* and 150*b*, in accordance with some embodiments. In some embodiments, the air gaps 134*a* and 134*c* are sealed by the capacitors 159*a* and 159*b*, respectively. The respective step is illustrated as the step S33 in the method 10 shown in FIG. 3.

As mentioned above, the capacitor 159*a* includes a bottom electrode 153*a*, a top electrode 157*a*, and a capacitor dielectric layer 155*a* sandwiched between the bottom electrode 153*a* and the top electrode 157*a*, and the capacitor 159*b* includes a bottom electrode 153*b*, a top electrode 157*b*, and a capacitor dielectric layer 155*b* sandwiched between the bottom electrode 153*b* and the top electrode 157*b*. The formation of the capacitors 159*a* and 159*b* may include sequentially depositing a conductive material, a dielectric material and another conductive material in the openings 150*a* and 150*b* (see FIG. 22) and extending over the landing pads 147*a*, 147*b* and 147*c*, and performing a planarization process (e.g., a CMP process) to remove excess portions of the two conductive materials and the dielectric material.

In some embodiments, the bottom electrodes 153*a* and 153*b* include titanium nitride (TiN), the capacitor dielectric layers 155*a* and 155*b* include a dielectric material, such as silicon dioxide ($SiO_2$), hafnium dioxide ($HfO_2$), aluminum oxide ($Al_2O_3$), zirconium dioxide ($ZrO_2$), or a combination thereof, and the top electrodes 157*a* and 157*b* include titanium nitride (TiN), low-stress silicon-germanium (SiGe), or a combination thereof. After the capacitors 159*a* and 159*b* are formed, the memory device 100 including capacitor contacts having different materials (e.g., polysilicon and titanium nitride (TiN)) is obtained. In some embodiments, the memory device 100 is part of a DRAM.

Figure 23:
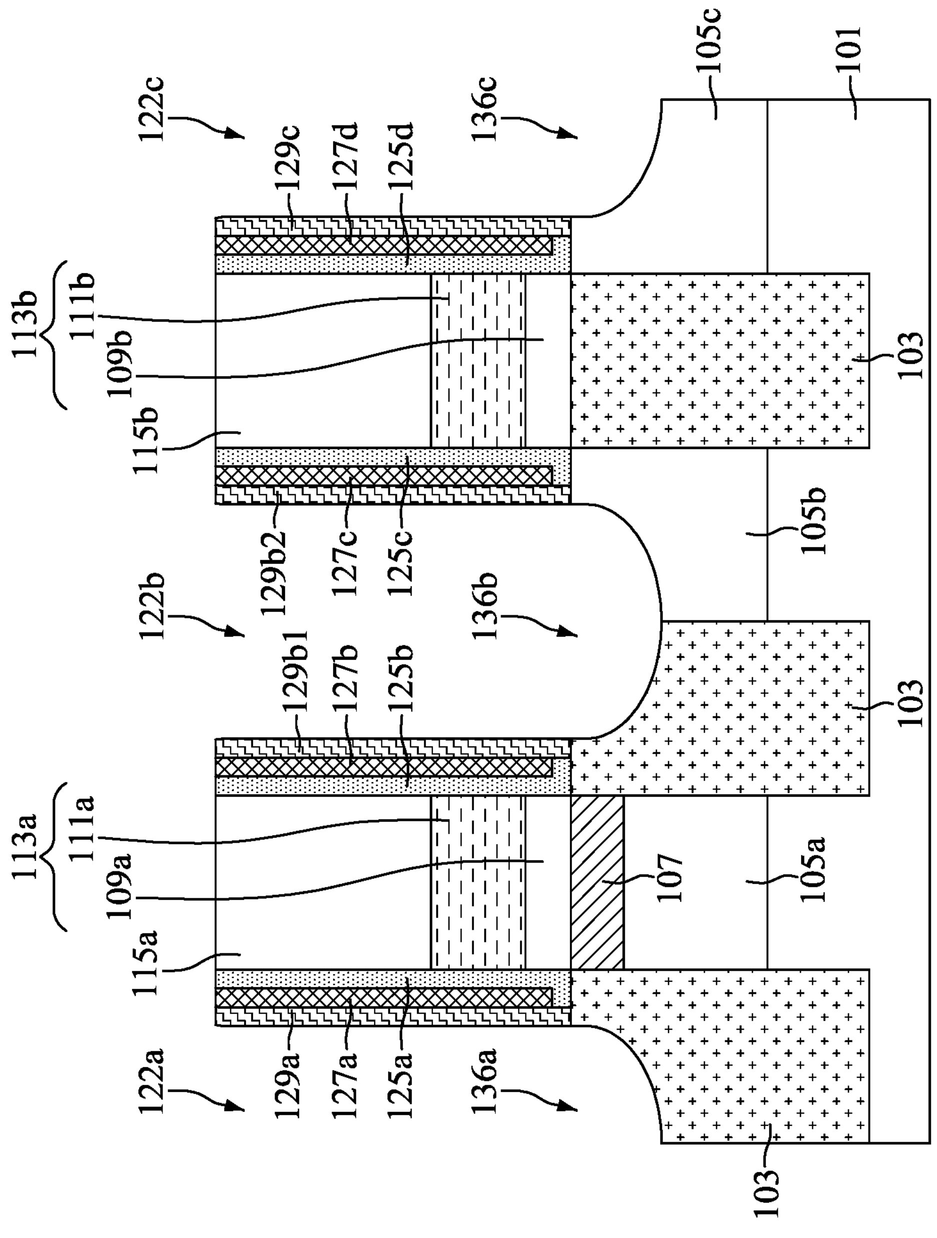
FIG. 23 is a cross-sectional view illustrating an intermediate stage of etching the second spacer layers and the semiconductor substrate to form the openings adjacent to the bit line structures after the second spacer material and the dielectric layer are planarized during the formation of the memory device, in accordance with some embodiments.

FIGS. 23 to 27 are cross-sectional views illustrating intermediate stages in the formation of the memory device 100, in accordance with some alternative embodiments. It should be pointed out that operations before the structure shown in FIG. 23 are substantially the same as the operations shown in FIGS. 4 to 11 (The steps S41 and S43 in the method 20 shown in FIG. 3 are the same as the steps S11 and S13 in the method 10 shown in FIG. 2), and the related detailed descriptions may refer to the foregoing paragraphs and are not discussed again herein.

After the planarization process is performed, the dielectric layer 131 is removed, and an etching process is performed to remove the horizontal portions of the second spacer layers 129*a*, 129*b* and 129*c* such that the semiconductor substrate 101 is exposed, and openings 136*a*, 136*b* and 136*c* are formed in the semiconductor substrate 101 by further etching the semiconductor substrate 101, as shown in FIG. 23 in accordance with some embodiments. The structure of FIG. 23 is similar to that of FIG. 14, except that in this embodiment the sacrificial layers 127*a*, 127*b*, 127*c* and 127*d* are not removed when the openings 136*a*, 136*b* and 136*c* are formed. The respective step is illustrated as the step S45 in the method 20 shown in FIG. 3.

In some embodiments, the horizontal portions of the second spacer layers 129*a*, 129*b* and 129*c* are removed by a dry etching process. In some embodiments, the semiconductor substrate 101 is etched by an etching process, which includes a dry etching process or a wet etching process. The remaining portions of the second spacer layers 129*a*, 129*b* and 129*c* are referred to as second spacer layers 129*a*, 129*b*1, 129*b*2 and 129*c*, as shown in FIG. 23.

Figure 24:
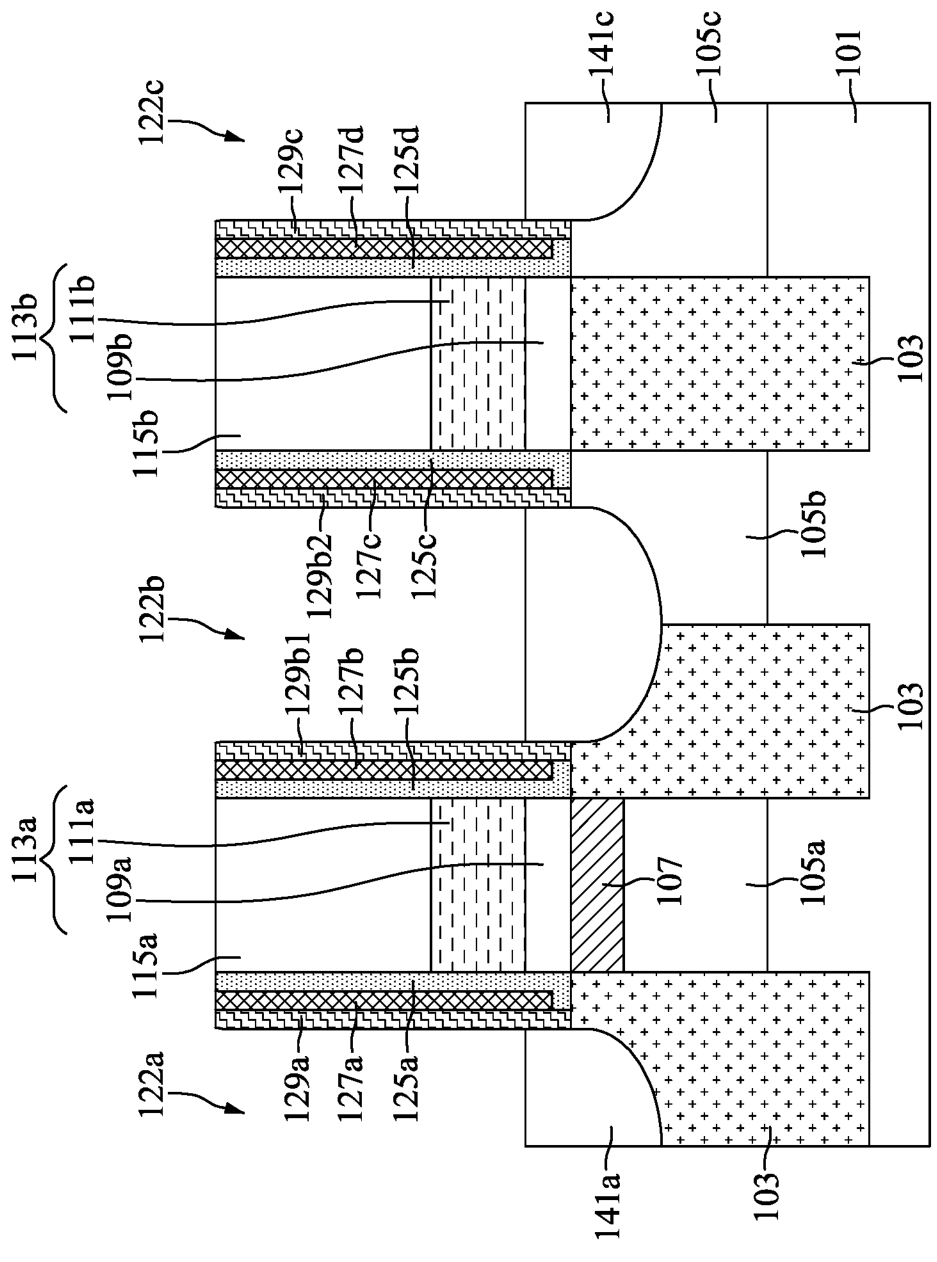
FIG. 24 is a cross-sectional view illustrating an intermediate stage of forming the lower capacitor contacts in the openings during the formation of the memory device, in accordance with some embodiments.

Next, the lower capacitor contacts 141*a*, 141*b* and 141*c* are formed in the openings 136*a*, 136*b* and 136*c* and extending over the semiconductor substrate 101, as shown in FIG. 24 in accordance with some embodiments. Some materials and processes used to form the lower capacitor contacts 141*a*, 141*b* and 141*c* in FIG. 24 are similar to, or the same as, those used to form the lower capacitor contacts 141*a*, 141*b* and 141*c* in FIGS. 15 and 16, and details thereof are not repeated herein. The respective steps are illustrated as the steps S47 and S49 in the method 20 shown in FIG. 3.

Figure 25:
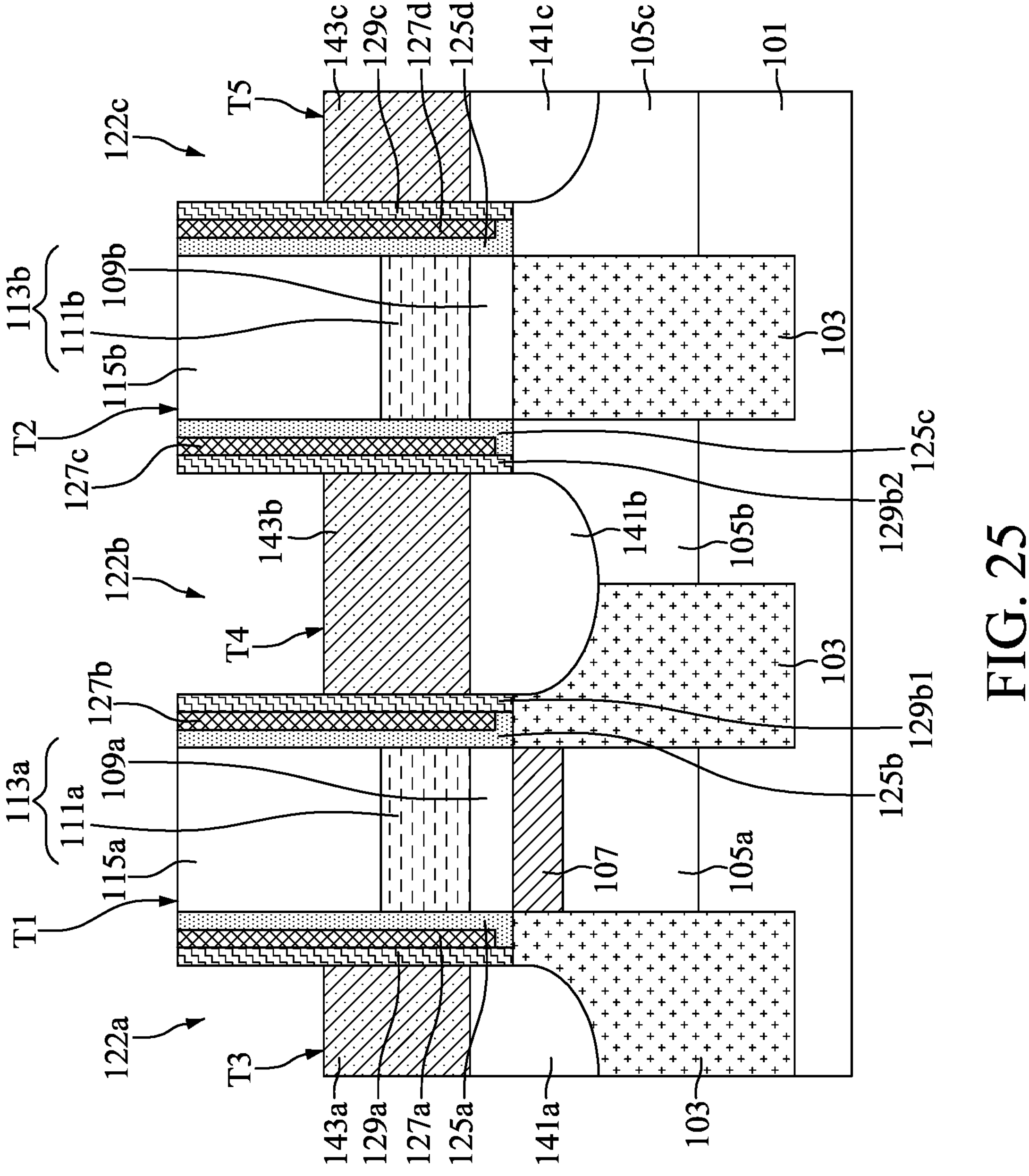
FIG. 25 is a cross-sectional view illustrating an intermediate stage of forming the upper capacitor contacts over the lower capacitor contacts during the formation of the memory device, in accordance with some embodiments.

Subsequently, the upper capacitor contacts 143*a*, 143*b* and 143*c* are formed in the openings 122*a*, 122*b* and 122*c* and over the lower capacitor contacts 141*a*, 141*b* and 141*c*, as shown in FIG. 25 in accordance with some embodiments. Some materials and processes used to form the upper capacitor contacts 143*a*, 143*b* and 143*c* in FIG. 25 are similar to, or the same as, those used to form the upper capacitor contacts 143*a*, 143*b* and 143*c* in FIGS. 17 and 18, and details thereof are not repeated herein.

The respective steps are illustrated as the steps S51 and S53 in the method 20 shown in FIG. 3. After the upper capacitor contacts 143*a*, 143*b* and 143*c* are formed, the top surfaces T1 and T2 of the bit line mask layers 115*a* and 155*b* are higher than the top surfaces T3, T4 and T5 of the upper capacitor contacts 143*a*, 143*b* and 143*c*, in accordance with some embodiments.

Figure 26:
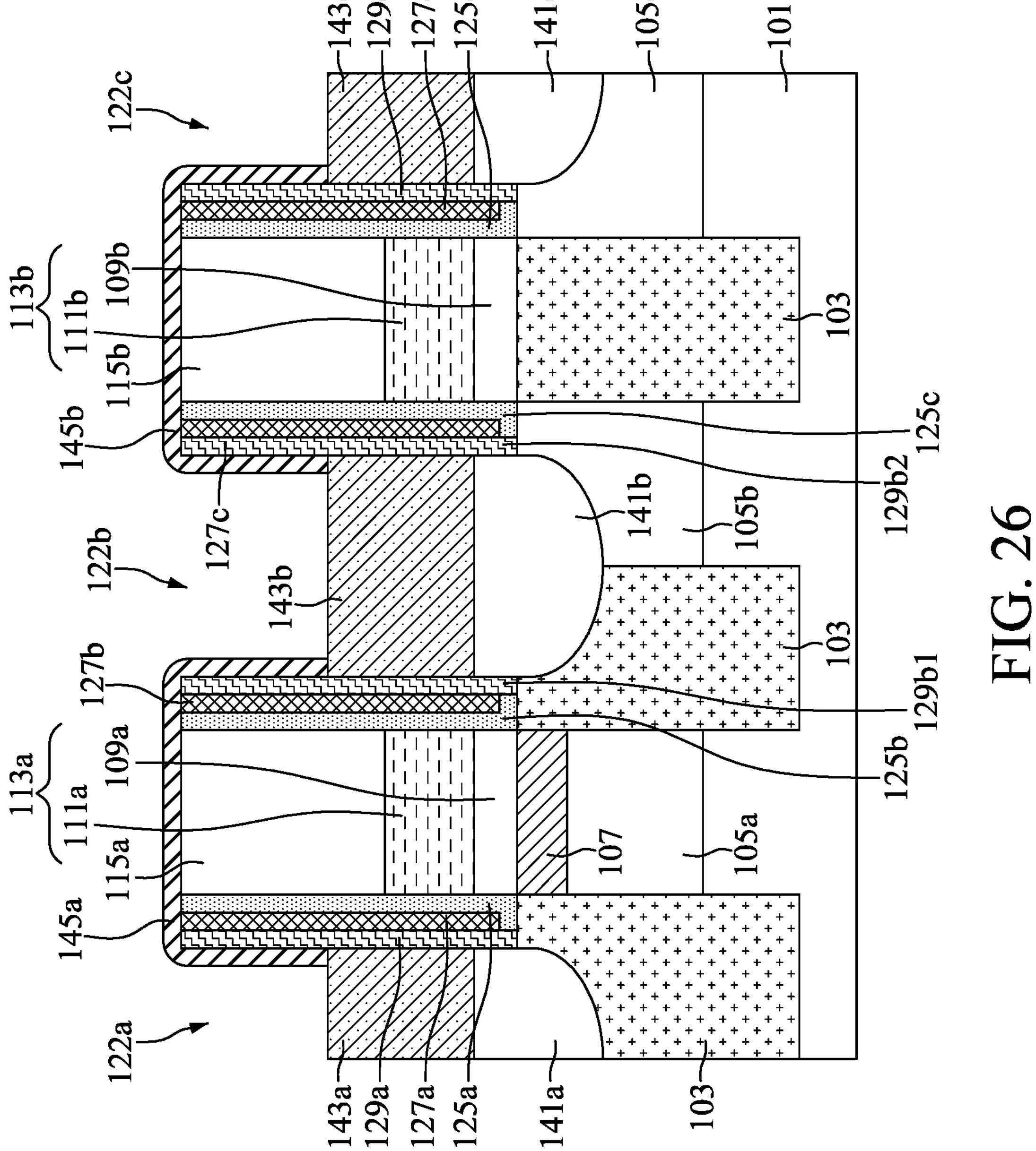
FIG. 26 is a cross-sectional view illustrating an intermediate stage of forming the third spacer layers covering the bit line mask layers, the first spacer layers, the sacrificial layers, and the second spacer layers during the formation of the memory device, in accordance with some embodiments.

Then, the third spacer layers 145*a* and 145*b* are formed, as shown in FIG. 26 in accordance with some embodiments. In some embodiments, the third spacer layer 145*a* is formed covering the bit line mask layer 115*a*, the first spacer layers 125*a*, 125*b*, the sacrificial layers 127*a*, 127*b*, and the second spacer layers 129*a*, 129*b*1, and the third spacer layer 145*a* extends to contact the upper capacitor contacts 143*a* and 143*b*. In some embodiments, the third spacer layer 145*b* is formed covering the bit line mask layer 115*b*, the first spacer layers 125*c*, 125*d*, the sacrificial layers 127*c*, 127*d*, and the second spacer layers 129*b*2, 129*c*, and the third spacer layer 145*b* extends to contact the upper capacitor contacts 143*b* and 143*c*.

Some materials and processes used to form the third spacer layers 145*a* and 145*b* in FIG. 26 are similar to, or the same as, those used to form the third spacer layers 145*a* and 145*b* in FIGS. 19 and 20, and details thereof are not repeated herein. The respective step is illustrated as the step S55 in the method 20 shown in FIG. 3.

Figure 27:
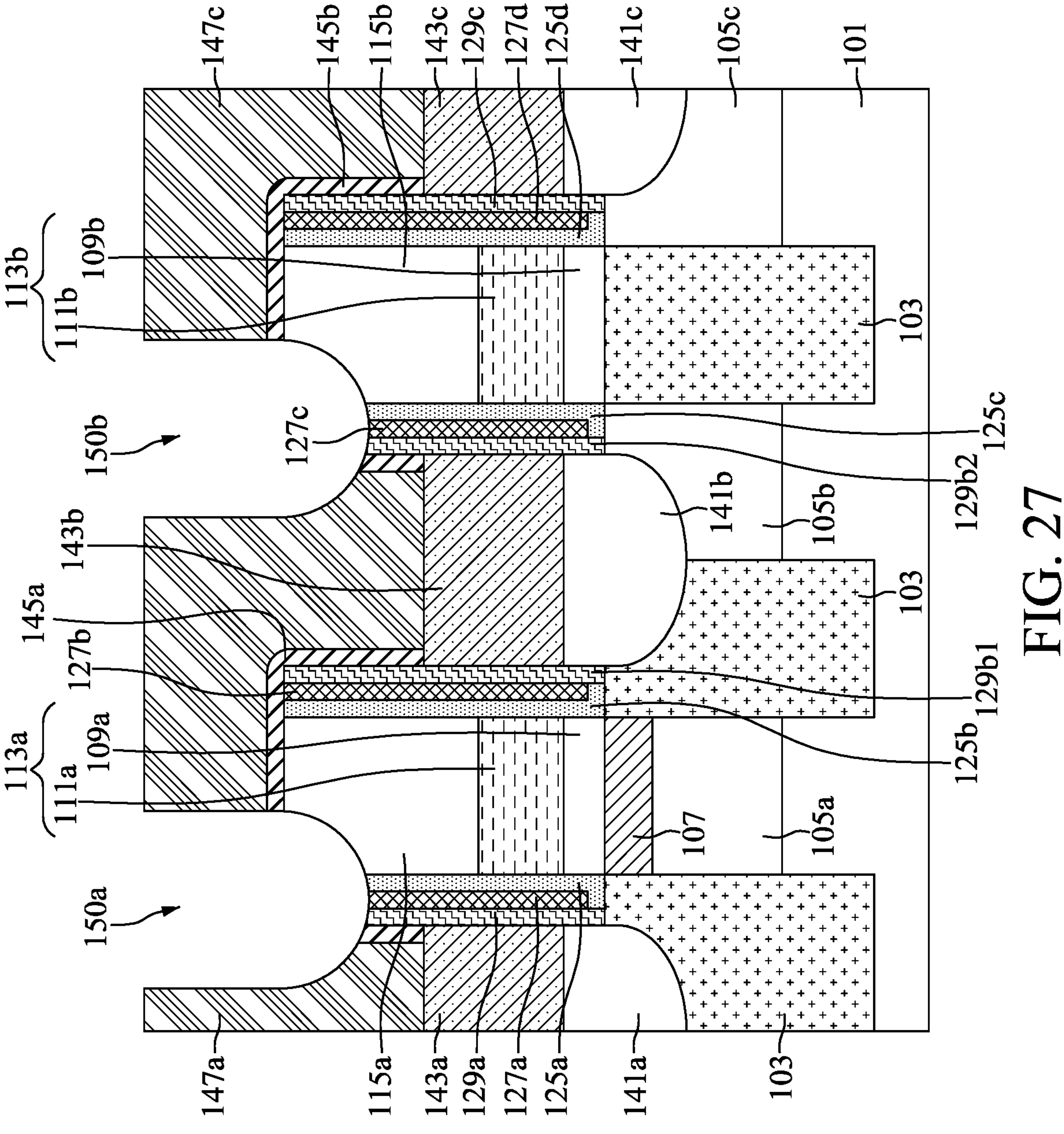
FIG. 27 is a cross-sectional view illustrating an intermediate stage of etching the landing pad layer, the first spacer layers, the sacrificial layers, the second spacer layers, and the third spacer layers to form openings during the formation of the memory device, in accordance with some embodiments.

Next, the landing pads 147*a*, 147*b*, 147*c* and the openings 150*a*, 150*b* are formed, as shown in FIG. 27 in accordance with some embodiments. Some materials and processes used to form the landing pads 147*a*, 147*b*, 147*c* and the openings

150*a*, 150*b* in FIG. 27 are similar to, or the same as, those used to form the landing pads 147*a*, 147*b* and 147*c* in FIGS. 21 and 22, and details thereof are not repeated herein. In some embodiments, the sacrificial layers 127*a* and 127*c* are partially removed by the etching process for forming the openings 150*a* and 150*b*. The respective steps are illustrated as the steps S57 and S59 in the method 20 shown in FIG. 3.

Subsequently, the sacrificial layers 127*a*, 127*b*, 127*c* and 127*d* are removed through the openings 150*a* and 150*b*, and the capacitors 159*a* and 159*b* are formed in the openings 150*a* and 150*b*, as shown in FIG. 1 in accordance with some embodiments. In some embodiments, an etching process is performed to remove the sacrificial layers 127*a*, 127*b*, 127*c* and 127*d* such that air gaps 134*a*, 134*b*, 134*c* and 134*d* are formed. In some embodiments, the etching process includes a dry etching process, a wet etching process, or a combination thereof.

After the capacitors 159*a* and 159*b* are formed, the air gaps 134*a* and 134*b* are sealed by the capacitors 159*a* and 159*b*, in accordance with some embodiments. The respective steps are illustrated as the steps S61 and S63 in the method 20 shown in FIG. 3. Some materials and processes used to form the capacitors 159*a* and 159*b* in this embodiment are similar to, or the same as, those used to form the capacitors 159*a* and 159*b* in the previous embodiment, and details thereof are not repeated herein.

Embodiments of the memory device 100 and method for preparing the same are provided in the disclosure. In some embodiments, the lower capacitor contacts 141*a*, 141*b*, 141*c* and the upper capacitor contacts 143*a*, 143*b*, 143*c* include different materials. For example, the lower capacitor contacts 141*a*, 141*b*, 141*c* include polysilicon, and the upper capacitor contacts 143*a*, 143*b*, 143*c* include titanium nitride (TiN). In some embodiments, the lower capacitor contacts 141*a*, 141*b*, 141*c* have a height H1, the upper capacitor contacts 143*a*, 143*b*, 143*c* have a height H2, and the height H2 is greater than or equal to the height H1. For example, a ratio of the height H2 to the height H1 is in a range from about 1 to about 1.5. Therefore, the sheet resistances of the capacitor contacts can be reduced while eliminating or suppressing the junction leak current. In addition, the air gaps 134*a*, 134*b*, 134*c* and 134*d* may help to reduce parasitic capacitance and correspondingly improve device performance (e.g., by reducing signal noise). As a result, the performance of the memory device 100 can be improved.

In one embodiment of the present disclosure, a memory device is provided. The memory device includes a bit line structure disposed over a semiconductor substrate, and a lower capacitor contact disposed in and extending above the semiconductor substrate. The lower capacitor contact includes polysilicon. The memory device also includes an upper capacitor contact disposed over the lower capacitor contact. The upper capacitor contact includes titanium nitride (TiN). The memory device further includes a first spacer layer disposed between the lower capacitor contact and the bit line structure and between the upper capacitor contact and the bit line structure. In addition, the memory device includes a capacitor disposed over the first spacer layer.

In another embodiment of the present disclosure, a memory device is provided. The memory device includes a bit line structure disposed over a semiconductor substrate, and a lower capacitor contact disposed in and extending above the semiconductor substrate. The memory device also includes an upper capacitor contact disposed over the lower capacitor contact. The upper capacitor contact and the lower capacitor contact include different materials. The memory device further includes a first spacer layer disposed between the lower capacitor contact and the bit line structure and between the upper capacitor contact and the bit line structure. In addition, the memory device includes a capacitor disposed over the first spacer layer, and a landing pad disposed over the upper capacitor contact and in direct contact with the capacitor.

In yet another embodiment of the present disclosure, a method for preparing a memory device is provided. The method includes forming a bit line structure over a semiconductor substrate, and forming a first spacer layer and a second spacer layer on a sidewall of the bit line structure. The method also includes etching the second spacer layer and the semiconductor substrate to form a first opening adjacent to the bit line structure, and filling the first opening with a lower capacitor contact. The lower capacitor contact protrudes over the semiconductor substrate. The method further includes forming an upper capacitor contact over the lower capacitor contact. The upper capacitor contact and the lower capacitor contact include different materials. In addition, the method includes forming a landing pad layer over the upper capacitor contact, etching the landing pad layer, the first spacer layer and the second spacer layer to form a second opening, and forming a capacitor in the second opening.

The embodiments of the present disclosure have some advantageous features. By forming lower capacitor contacts and upper capacitor contacts with different materials (e.g., the lower capacitor contacts including polysilicon, and the upper capacitor contacts including titanium nitride), the sheet resistances of the capacitor contacts can be reduced while eliminating or suppressing the junction leak current. As a result, the performance of the memory device can be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a memory device, comprising:

forming a bit line structure over a semiconductor substrate;

forming a first spacer layer and a second spacer layer on a sidewall of the bit line structure;

etching the second spacer layer and the semiconductor substrate to form a first opening adjacent to the bit line structure;

filling the first opening with a lower capacitor contact, wherein the lower capacitor contact protrudes over the semiconductor substrate;

forming an upper capacitor contact over the lower capacitor contact, wherein the upper capacitor contact and the lower capacitor contact comprise different materials;

forming a landing pad layer over the upper capacitor contact;

etching the landing pad layer, the first spacer layer and the second spacer layer to form a second opening;

forming a capacitor in the second opening;

forming a third spacer material covering the first spacer layer, the second spacer layer and the upper capacitor contact; and partially removing the third spacer material to expose the upper capacitor contact before the landing pad layer is formed.

2. The method for preparing a memory device of claim 1, further comprising:

forming a bit line mask layer over the bit line structure, wherein the first spacer layer extends to cover a sidewall of the bit line mask layer.

3. The method for preparing a memory device of claim 2, wherein a top surface of the bit line mask layer is higher than a top surface of the upper capacitor contact, and wherein the bit line mask layer is partially removed to form the second opening.

4. The method for preparing a memory device of claim 1, wherein the forming the lower capacitor contact comprises:

filling the first opening with a lower capacitor contact layer, wherein the lower capacitor contact layer extends over the first spacer layer, the second spacer layer and the bit line structure; and etching back the lower capacitor contact layer to expose a sidewall of the second spacer layer.

5. The method for preparing a memory device of claim 4, wherein the lower capacitor contact layer comprises polysilicon.

6. The method for preparing a memory device of claim 1, wherein the forming the upper capacitor contact comprises:

forming an upper capacitor contact layer over the lower capacitor contact, wherein the upper capacitor contact layer extends over the first spacer layer, the second spacer layer and the bit line structure; and etching back the upper capacitor contact layer to expose a sidewall of the second spacer layer.

7. The method for preparing a memory device of claim 6, wherein the upper capacitor contact layer comprises titanium nitride (TiN).

8. A method for preparing a memory device, comprising:

forming a bit line structure over a semiconductor substrate;

forming a first spacer layer and a second spacer layer on a sidewall of the bit line structure;

etching the second spacer layer and the semiconductor substrate to form a first opening adjacent to the bit line structure;

filling the first opening with a lower capacitor contact, wherein the lower capacitor contact protrudes over the semiconductor substrate;

forming an upper capacitor contact over the lower capacitor contact, wherein the upper capacitor contact and the lower capacitor contact comprise different materials;

forming a landing pad layer over the upper capacitor contact;

etching the landing pad layer, the first spacer layer and the second spacer layer to form a second opening;

forming a capacitor in the second opening;

forming a sacrificial layer on a sidewall of the first spacer layer before the second spacer layer is formed; and removing the sacrificial layer to form an air gap before the first opening is formed.

9. A method for preparing a memory device, comprising:

forming a bit line structure over a semiconductor substrate;

forming a first spacer layer and a second spacer layer on a sidewall of the bit line structure;

etching the second spacer layer and the semiconductor substrate to form a first opening adjacent to the bit line structure;

filling the first opening with a lower capacitor contact, wherein the lower capacitor contact protrudes over the semiconductor substrate;

forming an upper capacitor contact over the lower capacitor contact, wherein the upper capacitor contact and the lower capacitor contact comprise different materials;

forming a landing pad layer over the upper capacitor contact;

etching the landing pad layer, the first spacer layer and the second spacer layer to form a second opening;

forming a capacitor in the second opening;

forming a sacrificial layer on a sidewall of the first spacer layer before the second spacer layer is formed; and removing the sacrificial layer through the second opening to form an air gap.

* * * * *